US012622100B2

(12) United States Patent
Yoo et al.

(10) Patent No.: US 12,622,100 B2
(45) Date of Patent: May 5, 2026

(54) LIGHT EMITTING ELEMENT AND DISPLAY DEVICE INCLUDING THE SAME

(71) Applicant: Samsung Display Co., LTD., Yongin-si (KR)

(72) Inventors: Jae Woong Yoo, Seoul (KR); Jin Hyuk Jang, Hwaseong-si (KR); Sung Hwi Park, Suwon-si (KR); Sang Ho Jeon, Hwaseong-si (KR); Seon Hong Choi, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 666 days.

(21) Appl. No.: 17/967,177

(22) Filed: Oct. 17, 2022

(65) Prior Publication Data

US 2023/0163234 A1 May 25, 2023

(30) Foreign Application Priority Data

Nov. 23, 2021 (KR) ........................ 10-2021-0161846

(51) Int. Cl.
*H10H 20/81* (2025.01)
*H10H 20/816* (2025.01)
(Continued)

(52) U.S. Cl.
CPC .... *H10H 20/8215* (2025.01); *H10H 20/8162* (2025.01); *H10H 20/821* (2025.01); *H10H 20/84* (2025.01); *H10H 29/142* (2025.01)

(58) Field of Classification Search
CPC ................................................. H10H 20/8215
(Continued)

(56) References Cited

U.S. PATENT DOCUMENTS

2013/0228741 A1* 9/2013 Fu ........................ H10H 20/812
257/13

FOREIGN PATENT DOCUMENTS

KR 10-2016-0059569 5/2016
KR 10-2020-0029100 3/2020
(Continued)

OTHER PUBLICATIONS

K.Kohler at al., AIP Publishing for "Control of the Mg doping profile in III-N light-emitting diodes and its effect on the electroluminescence efficiency", dated May 10, 2005, 5 total pages.

*Primary Examiner* — Hsin Yi Hsieh
(74) *Attorney, Agent, or Firm* — Womble Bond Dickinson (US) LLP

(57) ABSTRACT

A light emitting element includes a light emitting element core including a first area and a second area surrounding the first area. The light emitting element core includes a first semiconductor layer doped with a first dopant, a second semiconductor layer disposed on the first semiconductor layer and doped with a second dopant, an element active layer disposed between the first semiconductor layer and the second semiconductor layer; and a third semiconductor layer disposed between the element active layer and the second semiconductor layer and doped with the second dopant. The second area of the light emitting element core is located on an outer circumference of the light emitting element core and includes an outer surface of the light emitting element core. A doping concentration of the second dopant of the third semiconductor layer is lower than a defect density of the second area of the light emitting element core.

12 Claims, 13 Drawing Sheets

(51) Int. Cl.
    *H10H 20/821*       (2025.01)
    *H10H 20/84*        (2025.01)
    *H10H 29/14*        (2025.01)

(58) Field of Classification Search
    USPC .......................................................... 257/89
    See application file for complete search history.

(56)                  References Cited

FOREIGN PATENT DOCUMENTS

| | | |
|---|---|---|
| KR | 10-2020-0102615 | 9/2020 |
| KR | 10-2223037 | 3/2021 |

* cited by examiner

LIGHT EMITTING ELEMENT AND DISPLAY DEVICE INCLUDING THE SAME

CROSS-REFERENCE TO RELATED APPLICATION(S)

This application claims priority to and benefits of Korean Patent Application No. 10-2021-0161846 under 35 U.S.C. § 119, filed on Nov. 23, 2021, in the Korean Intellectual Property Office (KIPO), the disclosure of which is incorporated by reference herein in its entirety.

BACKGROUND

1. Technical Field

The disclosure relates to a light emitting element and a display device including the same.

2. Description of the Related Art

The importance of display devices is increasing with the development of multimedia. Accordingly, various types of display devices, such as an organic light emitting display (OLED) device, a liquid crystal display (LCD) device, and the like are being used.

A device which displays an image of the display device includes a display panel such as an organic light emitting display panel or a liquid crystal display panel. Among the above, the light emitting display panel may include a light emitting element, and for example, a light emitting diode (LED) includes an organic light emitting diode (OLED) using an organic material as a light emitting material, an inorganic light emitting diode using an inorganic material as a light emitting material, and the like.

SUMMARY

Aspects of the disclosure provide a light emitting element capable of preventing or suppressing injection of holes from a central portion of a light emitting element core into a damaged surface area of the light emitting element core by a band bending effect between the central portion of the light emitting element core and the damaged surface area of the light emitting element core by including a second p-type semiconductor layer disposed between a first p-type semiconductor layer doped with a p-type dopant and an element active layer and having a doping concentration of the p-type dopant lower than a defect density of the damaged surface area of the light emitting element core.

Aspects of the disclosure also provide a light emitting element capable of preventing or suppressing injection of holes from a central portion of a light emitting element core into a damaged surface area of the light emitting element core by a band bending effect between the central portion of the light emitting element core and the damaged surface area of the light emitting element core by including a semiconductor layer disposed between a first p-type semiconductor layer doped with a p-type dopant and an element active layer and not doped with the p-type dopant.

Aspects of the disclosure also provide a display device capable of having improved light emitting efficiency by including the light emitting element.

However, aspects of the disclosure are not restricted to those set forth herein. The above and other aspects of the disclosure will become more apparent to one of ordinary skill in the art to which the disclosure pertains by referencing the detailed description of the disclosure given below.

According to the embodiments of the disclosure, a light emitting element may include a light emitting element core including a first area and a second area surrounding the first area. The light emitting element core may include a first semiconductor layer doped with a first conductivity-type dopant, a second semiconductor layer disposed on the first semiconductor layer, the second semiconductor layer doped with a second conductivity-type dopant different from the first conductivity-type dopant, an element active layer disposed between the first semiconductor layer and the second semiconductor layer; and a third semiconductor layer disposed between the element active layer and the second semiconductor layer, the third semiconductor layer doped with the second conductivity-type dopant. The second area of the light emitting element core may be located on an outer circumference of the light emitting element core, the second area of the light emitting element including an outer surface of the light emitting element core, and a doping concentration of the second conductivity-type dopant of the third semiconductor layer may be lower than a defect density of the second area of the light emitting element core.

The doping concentration of the second conductivity-type dopant of the third semiconductor layer may be about $10^{18}/cm^3$ or less.

The first semiconductor layer may be an n-type semiconductor layer, and the second semiconductor layer and the third semiconductor layer may each be a p-type semiconductor layer.

A light emitting element may further include an electron blocking layer disposed between the element active layer and the third semiconductor layer. The electron blocking layer may have a single-layer structure.

A light emitting element may further include an electron blocking layer disposed between the element active layer and the third semiconductor layer, wherein a thickness of the electron blocking layer may be about 5 nm or less.

A light emitting element may further include an electron blocking layer disposed between the element active layer and the third semiconductor layer. The electron blocking layer may include aluminum (Al), and a composition of the aluminum in the electron blocking layer may be about 15% or less.

The doping concentration of the second conductivity-type dopant of the third semiconductor layer may be lower than a doping concentration of the second conductivity-type dopant of the second semiconductor layer.

A thickness of the third semiconductor layer may be greater than a thickness of the second semiconductor layer.

A light emitting element may further include an electron blocking layer disposed between the element active layer and the third semiconductor layer. A thickness of the electron blocking layer may be smaller than the thickness of the third semiconductor layer.

The light emitting element core may extend in a first direction, the first semiconductor layer, the element active layer, the third semiconductor layer, and the second semiconductor layer mat be sequentially disposed in the first direction, and a width of the light emitting element core may be about 10 μm or less.

According to an embodiment of the disclosure, a light emitting element may include a first semiconductor layer doped with a first conductivity-type dopant, a second semiconductor layer disposed on the first semiconductor layer, the second semiconductor layer doped with a second conductivity-type dopant different from the first conductivity-type dopant, an element active layer disposed between the first semiconductor layer and the second semiconductor layer, and a third semiconductor layer disposed between the element active layer and the second semiconductor layer. The third semiconductor layer may be not doped with a conductivity-type dopant.

The first semiconductor layer may be an n-type semiconductor layer, and the second semiconductor layer may be a p-type semiconductor layer.

The light emitting element may further include an electron blocking layer disposed between the element active layer and the third semiconductor layer. The electron blocking layer may have a single-layer structure.

The light emitting element may further include an electron blocking layer disposed between the element active layer and the third semiconductor layer. A thickness of the electron blocking layer may be about 5 nm or less.

The light emitting element may further include an electron blocking layer disposed between the element active layer and the third semiconductor layer. The electron blocking layer may include aluminum (Al), and a composition of the aluminum in the electron blocking layer may be about 15% or less.

A thickness of the third semiconductor layer may be greater than a thickness of the second semiconductor layer.

The light emitting element may further include an electron blocking layer disposed between the element active layer and the third semiconductor layer. A thickness of the electron blocking layer may be smaller than the thickness of the third semiconductor layer.

According to an embodiment of the disclosure, a display device may include a first electrode and a second electrode disposed on a substrate and spaced apart from each other, and a light emitting element disposed between the first electrode and the second electrode. The light emitting element may include a light emitting element core including a first area and a second area surrounding the first area. The light emitting element core may include a first semiconductor layer doped with a first conductivity-type dopant, a second semiconductor layer disposed on the first semiconductor layer, the second semiconductor layer doped with a second conductivity-type dopant different from the first conductivity-type dopant, an element active layer disposed between the first semiconductor layer and the second semiconductor layer; and a third semiconductor layer disposed between the element active layer and the second semiconductor layer, the third semiconductor layer doped with the second conductivity-type dopant. The second area of the light emitting element core may be located on an outer circumference of the light emitting element core, the second area of the light emitting element including an outer surface of the light emitting element core, and a doping concentration of the second conductivity-type dopant of the third semiconductor layer may be lower than a defect density of the second area of the light emitting element core.

The doping concentration of the second conductivity-type dopant of the third semiconductor layer may be about $10^{18}/cm^3$ or less.

According to an embodiment of the disclosure, a display device may include a first electrode and a second electrode disposed on a substrate and spaced apart from each other, and a light emitting element disposed between the first electrode and the second electrode. The light emitting element may include a first semiconductor layer doped with a first conductivity-type dopant, a second semiconductor layer disposed on the first semiconductor layer, the second semiconductor layer doped with a second conductivity-type dopant different from the first conductivity-type dopant, an element active layer disposed between the first semiconductor layer and the second semiconductor layer; and a third semiconductor layer disposed between the element active layer and the second semiconductor layer. The third semiconductor layer may be not doped with a conductivity-type dopant.

The light emitting element according to an embodiment may include a second p-type semiconductor layer disposed between a first p-type semiconductor layer doped with a p-type dopant and an element active layer. A doping concentration of the p-type dopant of the second p-type semiconductor layer may be lower than a defect density of a damaged surface area of a light emitting element core. Accordingly, it is possible to prevent or suppress injection of holes from a central portion of the light emitting element core into the damaged surface area of the light emitting element core by a band bending effect between the central portion of the light emitting element core and the damaged surface area of the light emitting element core.

The light emitting element according to an embodiment of the disclosure may include a semiconductor layer disposed between a p-type semiconductor layer doped with a p-type dopant and an element active layer that is not doped with the p-type dopant. Accordingly, it is possible to prevent or suppress injection of holes from a central portion of the light emitting element core into the damaged surface area of the light emitting element core by a band bending effect at an interface portion between the central portion of the light emitting element core and the damaged surface area of the light emitting element core.

Accordingly, non-radiative recombination in the damaged surface area of the light emitting element core may be reduced, so that light emitting efficiency of the light emitting element may be improved.

Since the display device according to an embodiment includes the light emitting element, light emitting efficiency per unit area may be improved.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which:

FIG. 11 is a schematic cross-sectional view illustrating an embodiment taken along line Q-Q' of FIG. 10;

DETAILED DESCRIPTION OF THE EMBODIMENTS

Figure 1:
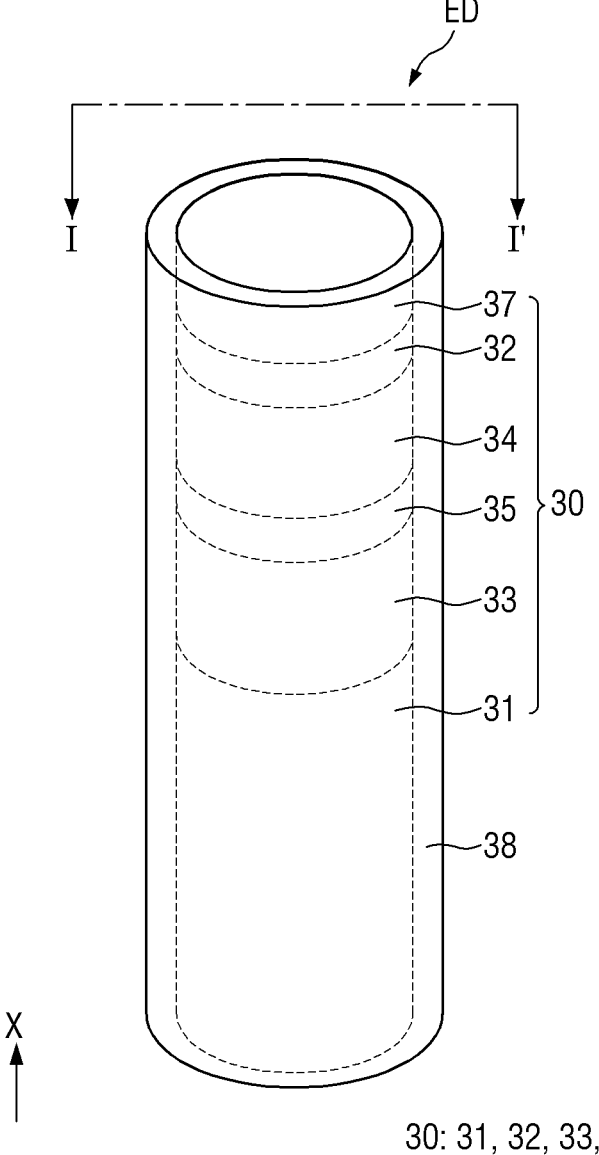
FIG. 1 is a schematic perspective view of a light emitting element according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of" modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
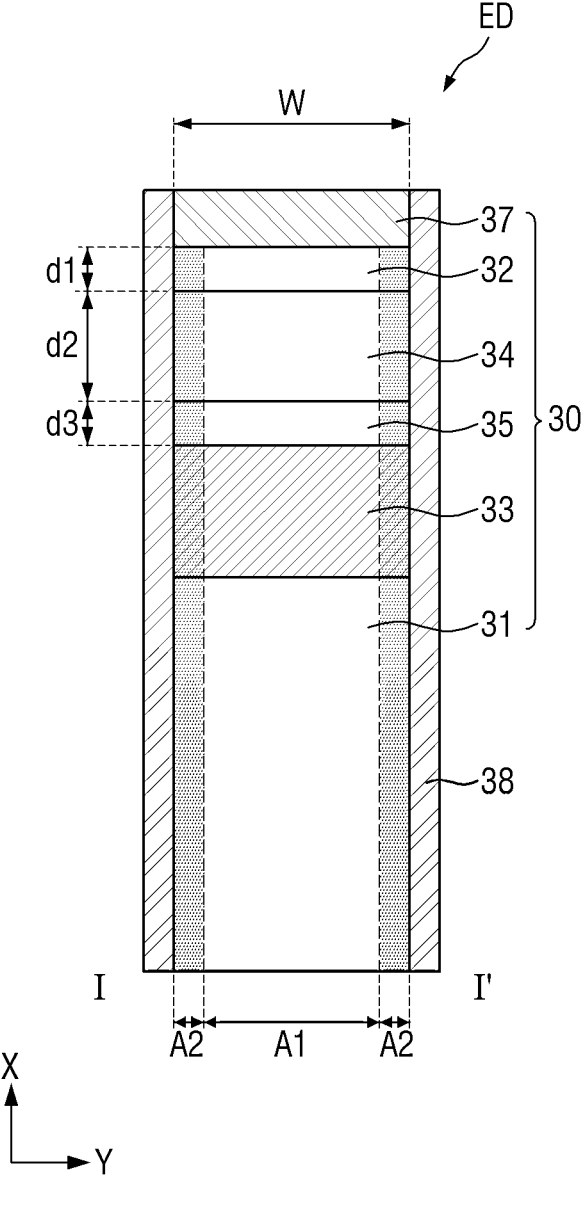
FIG. 2 is a schematic cross-sectional view of the light emitting element illustrating an embodiment taken along line I-I' of FIG. 1.
Figure 3:
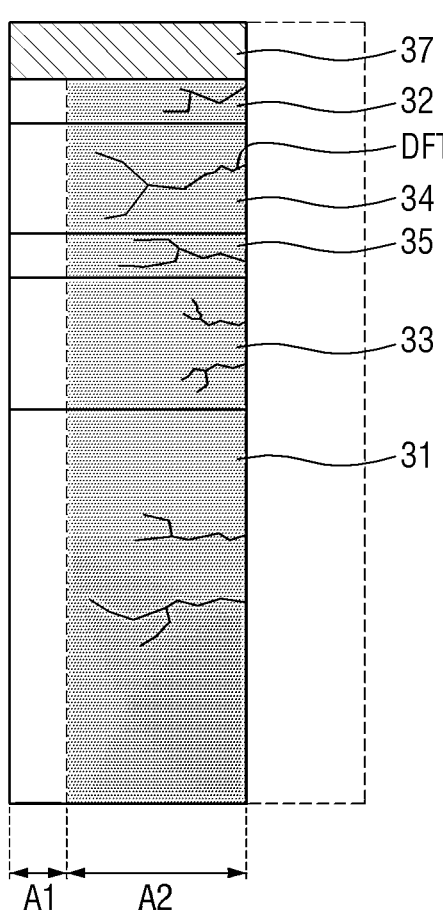
FIG. 3 is a schematic enlarged cross-sectional view illustrating a light emitting element core according to an embodiment.

FIG. 1 is a schematic perspective view of a light emitting element according to an embodiment. FIG. 2 is a schematic cross-sectional view of the light emitting element illustrating an embodiment taken along line I-I' of FIG. 1. FIG. 3 is a schematic enlarged cross-sectional view illustrating a light emitting element core according to an embodiment.

Referring to FIGS. 1 to 3, the light emitting element ED may be a particle type element, and may have a rod shape or a cylindrical shape having an aspect ratio. The light emitting element ED has a shape extending in one direction X, and a length of the light emitting element ED in the extending direction (or longitudinal direction X) may be greater than a diameter of the light emitting element ED, and the aspect ratio thereof may be 1.2:1 to 100:1, but is not limited thereto. For example, the light emitting element ED may have a shape such as a cylinder, a rod, a wire, a tube, and the like, may have a polygonal prism shape such as a cube, a rectangular parallelepiped, or a hexagonal prism, or may have a shape extending in one direction and having an outer surface partially inclined. Hereinafter, in the drawings for explaining the shape of the light emitting element ED, the terms of the one direction X, the extension direction X of the light emitting element ED, and the longitudinal direction X of the light emitting element ED may be interchangeably used.

The light emitting element ED may have a size of a nanometer scale (1 nm or more and less than 1 μm) to a micrometer scale (1 μm or more and less than 1 mm). In an embodiment, the light emitting element ED may have a size of a nanometer scale or have a size of a micrometer scale, in both the diameter and the length thereof. In other embodiments, the diameter of the light emitting element ED may have a size of a nanometer scale, while the length of the light emitting element ED may have a size of a micrometer scale. In embodiments, some light emitting elements ED may have a size of a nanometer scale in diameter and/or length, while other light emitting elements ED may have a size of a micrometer scale in diameter and/or length.

In an embodiment, the light emitting element ED may be an inorganic light emitting diode. The inorganic light emitting diode may include multiple semiconductor layers. For example, the inorganic light emitting diode may include a first conductivity-type (e.g., n-type) semiconductor layer, a second conductivity-type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and the electrons reaching the active semiconductor layer may be combined with each other to emit light. The inorganic light emitting diode may be aligned between two electrodes in which polarities are formed in case that an electric field is formed in a specific direction between the two electrodes facing each other.

The light emitting element ED may include a light emitting element core 30 and an element insulating layer 38.

The light emitting element core 30 may have a shape extending in one direction X. The light emitting element core 30 may have a rod or cylindrical shape. However, the light emitting element core 30 is not limited thereto and may have a polygonal prism shape such as a cube, a rectangular parallelepiped, or a hexagonal prism or may have a shape extending in one direction X and having an outer surface partially inclined.

The light emitting element core 30 according to an embodiment may include multiple semiconductor layers and an element electrode layer 37. The multiple semiconductor layers of the light emitting element core 30 may include a first semiconductor layer 31, a second semiconductor layer 32, an element active layer 33, a third semiconductor layer 34, and an electron blocking layer 35. The first semiconductor layer 31, the element active layer 33, the electron blocking layer 35, the third semiconductor layer 34, the second semiconductor layer 32, and the element electrode layer 37 may be sequentially stacked each other along one direction X, which is a longitudinal direction of the light emitting element core 30.

The light emitting element core 30 may include a first area A1 and a second area A2. The first area A1 of the light emitting element core 30 may be a central area in the multiple semiconductor layers of the light emitting element core 30. The first area A1 of the light emitting element core 30 may occupy most of the area of the light emitting element core 30. The second area A2 of the light emitting element core 30 may surround the first area A1 of the light emitting element core 30. The second area A2 of the light emitting element core 30 may be a damaged surface area A2 of the light emitting element core 30 including an outer circumference surface of the light emitting element core 30. Hereinafter, for convenience of explanation in the specification, the second area A2 of the light emitting element core 30 may also be referred to as a damaged surface area A2 of the light emitting element core 30. The first area A1 and the second area A2 of the light emitting element core 30 may be divided according to a relative size of a defect density without a physical interface.

The multiple semiconductor layers of the light emitting element core 30 may have a damaged surface area A2 having a thickness from an outer surface of each semiconductor layer. The damaged surface area A2 of the semiconductor layer of the light emitting element core 30 may be formed in an etching process of the multiple semiconductor layers during a manufacturing process of the light emitting element ED. For example, the light emitting element ED may be manufactured by forming multiple semiconductor layers on a target substrate by an epitaxial growth method, and then etching the semiconductor layers in a direction perpendicular to a top surface of the target substrate. The semiconductor layers grown on the target substrate may be smoothly grown without inter-crystal lattice defects depending on the growth conditions, but in a process of etching the semiconductor layers, a defect DFT may occur on an etched surface (e.g., an outer circumference surface) of the semiconductor layers. Accordingly, the light emitting element core 30 may include the damaged surface area A2 of the light emitting element core 30 having a high defect density and the first area A1 of the light emitting element core 30.

The first semiconductor layer 31 may be doped with a first conductivity-type dopant. The first conductivity-type may be an n-type, and the first conductivity-type dopant may include Si, Ge, Sn, or the like. For example, the first semiconductor layer 31 may be an n-type semiconductor. In an embodiment in which the light emitting element ED emits light in a blue wavelength band, the first semiconductor layer 31 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the first semiconductor layer 31 may include any one semiconductor material of AlGaInN, GaN, AlGaN, InGaN, AlN, and InN doped with the first conductivity-type dopant, but is not limited thereto. In an embodiment, the first semiconductor layer 31 may be n-GaN doped with n-type Si.

The second semiconductor layer 32 may be disposed to be spaced apart from the first semiconductor layer 31 with the element active layer 33 interposed therebetween. The second semiconductor layer 32 may be doped with a second conductivity-type dopant. The second conductivity-type may be a p-type, and the second conductivity-type dopant may include Mg, Zn, Ca, Sr, Ba, or the like. For example, the second semiconductor layer 32 may be a p-type semiconductor. In an embodiment in which the light emitting element ED emits light in a blue wavelength band, the second semiconductor layer 32 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the second semiconductor layer 32 may include any one semiconductor material of AlGaInN, GaN, AlGaN, InGaN, AlN, and InN doped with the second conductivity-type dopant, but is not limited thereto. In an embodiment, the second semiconductor layer 32 may be p-GaN doped with p-type Mg.

It has been illustrated in drawings that the first semiconductor layer 31 and the second semiconductor layer 32 are configured as one layer, but the disclosure is not limited thereto. The first semiconductor layer 31 and the second semiconductor layer 32 may further include multiple layers, for example, a clad layer or a tensile strain barrier reducing (TSBR) layer, according to a material included in the element active layer 33.

The element active layer 33 may be disposed between the first semiconductor layer 31 and the second semiconductor layer 32. The element active layer 33 may include a material having a single or multiple quantum well structure. The element active layer 33 may emit light by a combination of electron-hole pairs according to an electrical signal applied through the first semiconductor layer 31 and the second semiconductor layer 32. For example, in case that the element active layer 33 emits light in a blue wavelength band, the element active layer 33 may include a material such as AlGaN or AlGaInN, but is not limited thereto.

In embodiments, the element active layer 33 may have a structure in which semiconductor materials having large band gap energy and semiconductor materials having small band gap energy are alternately stacked each other, and may include other Group III to Group V semiconductor materials according to a wavelength band of emitted light. The light emitted by the element active layer 33 is not limited to the light in the blue wavelength band, and in some cases, the element active layer 33 may emit light in a red or green wavelength band.

The light emitted from the element active layer 33 may be emitted not only from both end surfaces in one direction X, which is a longitudinal direction of the light emitting element ED, but also from a side surface of the light emitting element ED. An emission direction of the light emitted from the element active layer 33 is not limited to one direction.

The electron blocking layer 35 may be disposed between the second semiconductor layer 32 and the element active layer 33. The electron blocking layer 35 may serve to prevent electrons from being injected from the first semiconductor layer 31. The electron blocking layer 35 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the electron blocking layer 35 may include any one semiconductor material of AlGaInN, AlGaN, and AlN, but is not limited thereto.

In an embodiment, the electron blocking layer 35 may have a single-layer structure. In embodiments, the electron blocking layer 35 may include aluminum (Al), and an aluminum composition of the electron blocking layer 35 may be 15% or less. In embodiments, a thickness d3 of the electron blocking layer 35 may be about 5 nm or less.

The third semiconductor layer 34 may be disposed between the second semiconductor layer 32 and the electron blocking layer 35. The third semiconductor layer 34 may be disposed between the element active layer 33 and the second semiconductor layer 32 to serve to prevent the holes of the second semiconductor layer 32 from leaking into the damaged surface area A2 of the light emitting element core 30 to be described later.

In an embodiment, the third semiconductor layer 34 may be doped with a second conductivity-type dopant. The second conductivity-type may be a p-type, and the second conductivity-type dopant may include Mg, Zn, Ca, Sr, Ba, or the like. For example, the third semiconductor layer 34 may be a p-type semiconductor. In an embodiment, the third semiconductor layer 34 may be p-GaN doped with p-type Mg.

In an embodiment, a doping concentration of the second conductivity-type dopant doped in the third semiconductor layer 34 may be lower than that of the second conductivity-type dopant doped in the second semiconductor layer 32. The doping concentration of the second conductivity-type dopant doped in the third semiconductor layer 34 may be lower than a defect density of the damaged surface area A2 of the light emitting element core 30. The doping concentration of the second conductivity-type dopant of the third semiconductor layer 34 may have a range of $10^{18}/cm^3$ or less. In an embodiment in which the second semiconductor layer 32 and the third semiconductor layer 34 are each doped with p-type Mg, an Mg doping concentration of the third semiconductor layer 34 may be lower than an Mg doping concentration of the second semiconductor layer 32. The Mg doping concentration of the third semiconductor layer 34 may be lower than the defect density of the damaged surface area A2 of the light emitting element core 30, and may have a range of $10^{18}/cm^3$ or less.

In case that both ends of the light emitting element ED and the electrode are electrically connected to each other in order to apply an electric signal to the first semiconductor layer 31 and the second semiconductor layer 32, the element electrode layer 37 may be disposed between the second semiconductor layer 32 and the electrode to serve to reduce resistance. The element electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The element electrode layer 37 may also include a semiconductor material doped with an n-type or p-type dopant.

The element insulating layer 38 may be disposed to surround the side surface of the light emitting element core 30. The element insulating layer 38 may be disposed to surround at least a side surface of the element active layer 33, and may extend in one direction X in which the light emitting element core 30 extends. The element insulating layer 38 may function to protect the multiple semiconductor layers and the element active layer 33 of the light emitting element core 30. Since the element insulating layer 38 includes a material having insulating properties, it is possible to prevent an electrical short-circuit that may occur in case that an electrode that transmits an electrical signal to the light emitting element ED and the element active layer 33 are in direction contact with each other. The element insulating layer 38 may protect each side surface of the multiple semiconductor layers as well as the element active layer 33, and may thus prevent a decrease in light emitting efficiency of the light emitting element ED.

It has been illustrated in the drawings that the element insulating layer 38 extends in one direction X on the side surface of the light emitting element core 30 to completely cover from the side surface of the first semiconductor layer 31 to the side surface of the element electrode layer 37, but the disclosure is not limited thereto. For example, the element insulating layer 38 may cover only the side surfaces of the element active layer 33 as well as some semiconductor layers, or may cover a partial area of the side surface of the element electrode layer 37, but may expose other partial areas of the side surface of the element electrode layer 37. It has been illustrated in the drawings that the element insulating layer 38 is formed as a single layer, but the disclosure is not limited thereto. For example, the element insulating layer 38 may have a structure in which multiple insulating layers including an insulating material are stacked each other.

In an embodiment, a diameter W of the light emitting element core 30 may be about 10 μm or less. In case that the diameter W of the light emitting element core 30 is about 10 μm or less, an area ratio of the outer circumference surface of the light emitting element core 30 may be relatively increased. Accordingly, in the light emitting element core 30, a ratio of the damaged surface area A2 of the light emitting element core 30 may be relatively rapidly increased. A surface defect DFT may occur in the light emitting element core 30, and thus a relative ratio of the damaged surface area A2 of the light emitting element core 30 having a high defect density may increase.

As described above, the surface defect DFT may occur in the process of etching the semiconductor layers during the manufacturing process of the light emitting element ED, and the surface defect DFT may include vacancy defects of gallium (Ga) or nitrogen (N) positioned on the outer surfaces of the multiple semiconductor layers. Due to the surface defect DFT, holes or electrons may leak from the first area A1 of the light emitting element core 30 to the damaged surface area A2 of the light emitting element core 30, and non-radiative recombination may occur in the damaged surface area A2 of the light emitting element core 30.

In case that the diameter of the light emitting element ED decreases, a ratio of non-radiative recombination may increase as the ratio of the damaged surface area A2 of the light emitting element core 30 is rapidly increased. Accordingly, holes of the second semiconductor layer 32 may leak into the damaged surface area A2 of the light emitting element core 30, and thus a ratio of holes that do not emit light in the element active layer 33 may increase, so that the light emitting efficiency of the light emitting element ED may be reduced. Therefore, there is a need to efficiently prevent the holes from leaking from the second semiconductor layer 32 overlapping the first area A1 of the light emitting element core 30 to the damaged surface area A2 of the light emitting element core 30.

The light emitting element ED according to the disclosure may prevent holes from leaking from the first area A1 of the second semiconductor layer 32 to the damaged surface area A2 of the light emitting element core 30 by including the third semiconductor layer 34 disposed between the second semiconductor layer 32 and the element active layer 33 and doped with a second conductivity-type dopant having a doping concentration lower than the defect density of the damaged surface area A2 of the light emitting element core 30 or a doping concentration having a range of $10^{18}/cm^3$ or less. A detailed description thereof will be provided later.

In an embodiment, a thickness d2 of the third semiconductor layer 34 may be greater than a thickness d1 of the second semiconductor layer 32. The thickness d2 of the third semiconductor layer 34 may be greater than a thickness d3 of the electron blocking layer 35. By forming the thickness d2 of the third semiconductor layer 34 to be greater than the thickness d1 of the second semiconductor layer 32 and the thickness d3 of the electron blocking layer 35, the third semiconductor layer 34 may effectively prevent the holes provided from the second semiconductor layer 32 from leaking into the damaged surface area A2 of the light emitting element core 30 between the second semiconductor layer 32 and the element active layer 33.

Figure 4:
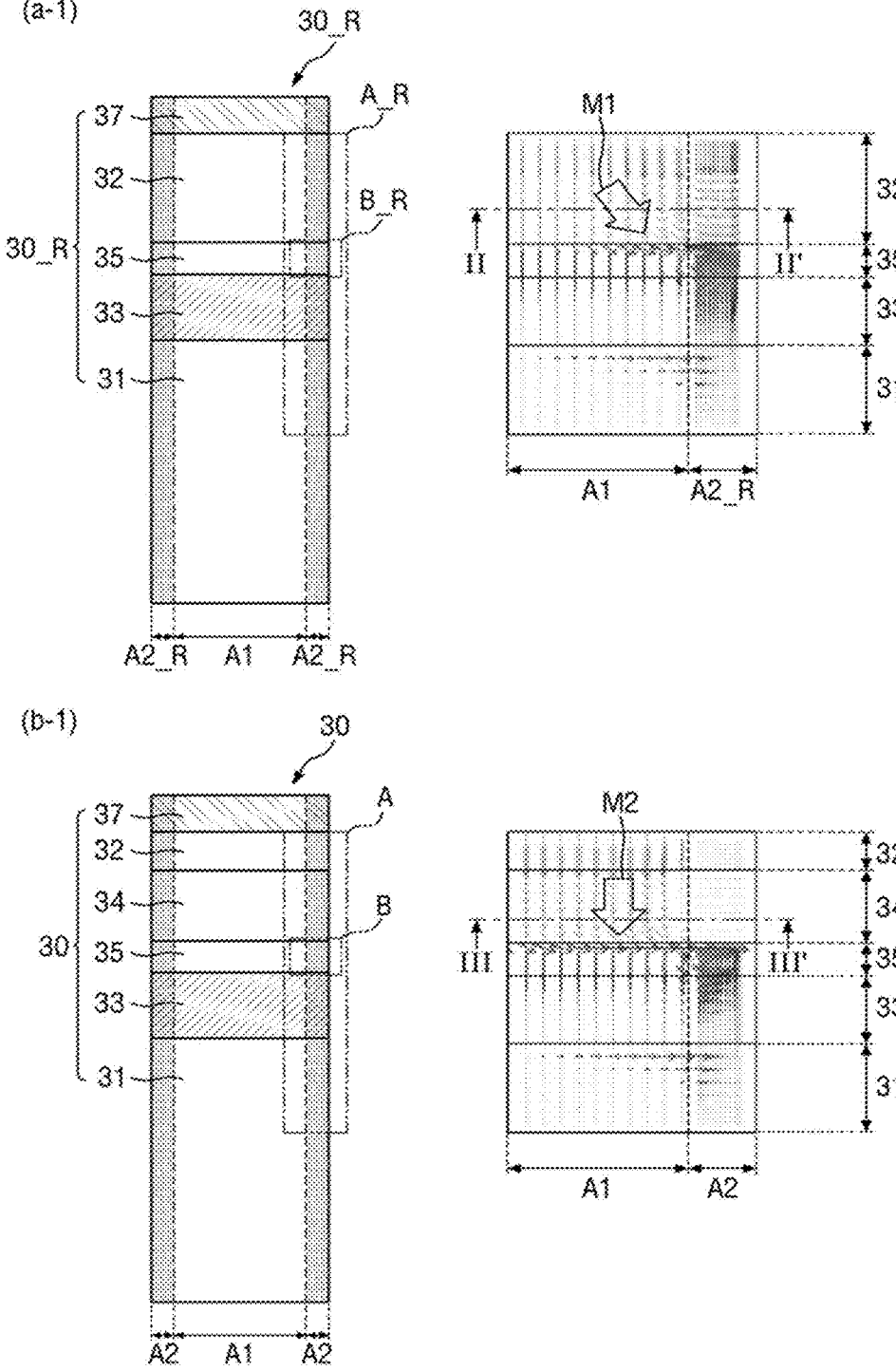
FIG. 4 is a schematic view for comparing a light emitting element core not including a third semiconductor layer and a light emitting element core including a third semiconductor layer.
Figure 5:
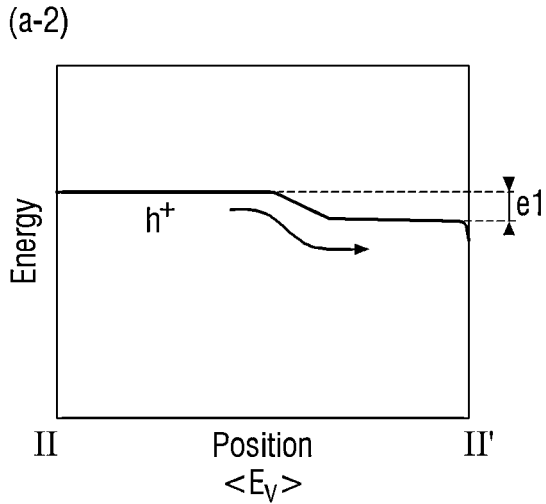
FIG. 5 is a view illustrating a schematic band diagram of a light emitting element core taken along lines II-II' and III-III' of FIG. 4.
Figure 5:
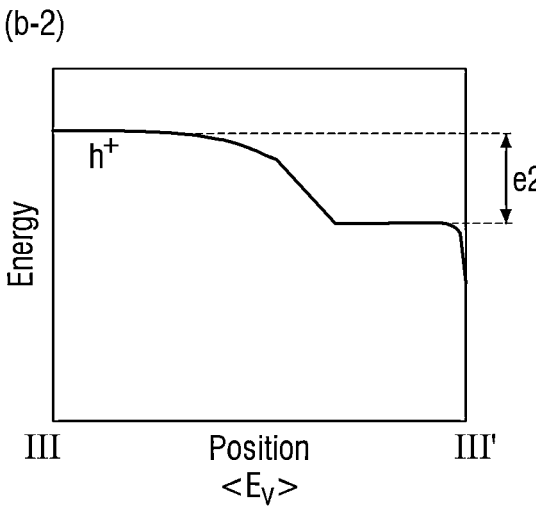
Figure 6:
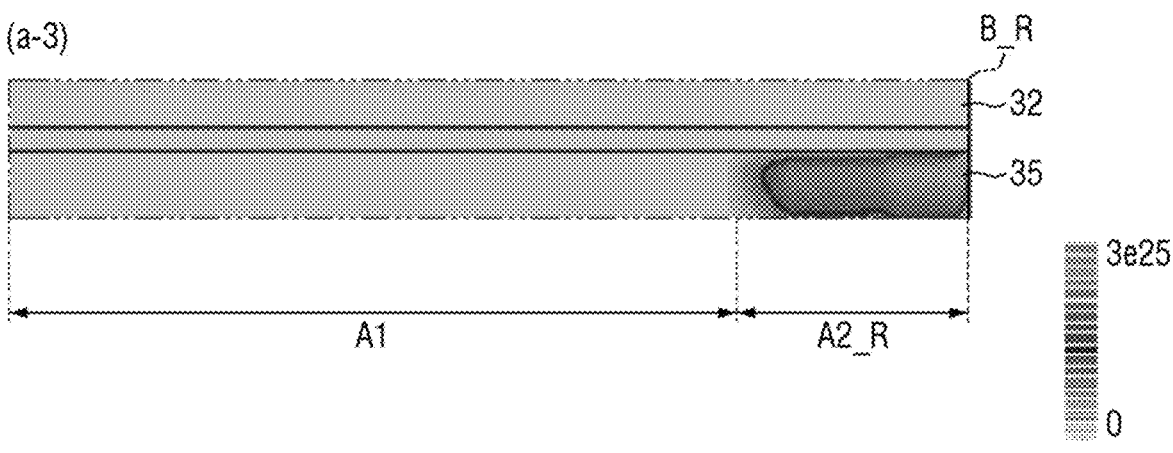
FIG. 6 is a view illustrating recombination rate contour maps of areas B_R and B of FIG. 4.
Figure 6:
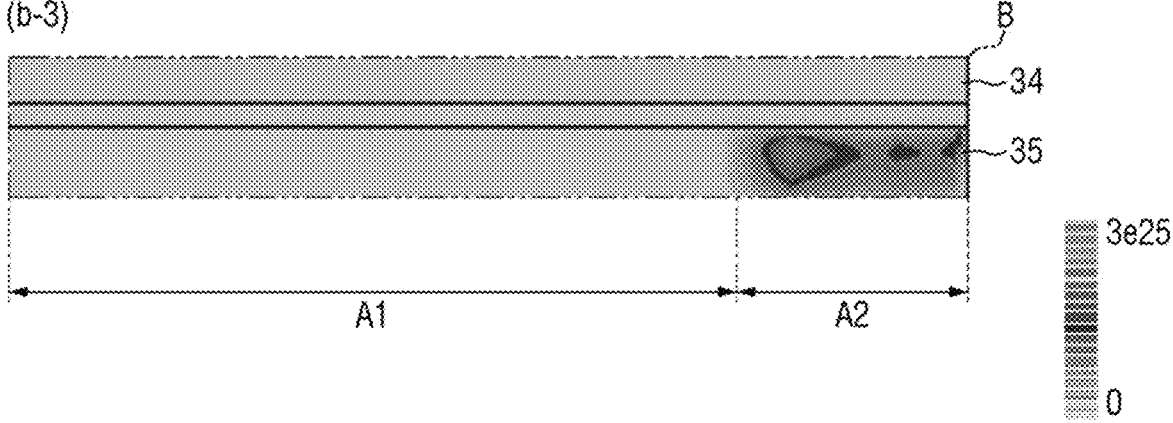

FIG. 4 is a schematic view for comparing a light emitting element core not including a third semiconductor layer and a light emitting element core including a third semiconductor layer. FIG. 5 is a view illustrating a schematic band diagram of a light emitting element core taken along lines II-II' and III-III' of FIG. 4. FIG. 6 is a view illustrating recombination rate contour maps of areas B_R and B of FIG. 4.

First, referring to FIG. 4, a light emitting element core 30_R illustrated in (a-1) of FIG. 4 may be a light emitting element core in which the third semiconductor layer 34 is omitted, and the light emitting element core 30 illustrated in (b-1) of FIG. 4 may be a light emitting element core 30 according to the disclosure, which may be a light emitting element core in which the third semiconductor layer 34 is further disposed between the second semiconductor layer 32 and the electron blocking layer 35. A vector map of hole currents in an area A_R of the light emitting element core 30_R is illustrated on a right side of the light emitting element core 30_R in (a-1) of FIG. 4, and a vector map of hole currents in area A of the light emitting element core 30 is illustrated on a right side of the light emitting element core 30 in (b-1) of FIG. 4. Purple to red in the vector map of the hole current may indicate an amount of the hole current. For example, purple may mean that a small amount of hole current flows, and red may mean that a large amount of hole current flows.

Referring to (a-1) of FIG. 4, in case that a semiconductor layer having a lower doping concentration of the second conductivity-type dopant is not interposed between the second semiconductor layer 32 and the electron blocking layer 35, it may be seen that a large amount of hole current flows in a damaged surface area A2_R of the second semiconductor layer 32. It may be seen that holes provided from the first area A1 of the second semiconductor layer 32 have a hole flow M1 flowing from the first area A1 of the second semiconductor layer 32 to the damaged surface area A2_R of the electron blocking layer 35.

Referring to (b-1) of FIG. 4, in case that the third semiconductor layer 34 having a doping concentration of the second conductivity-type dopant lower than the defect density of the damaged surface area A2 of the light emitting element core 30 is interposed between the second semiconductor layer 32 and the electron blocking layer 35, it may be seen that a small amount of hole current flows in the damaged surface area A2 of the second semiconductor layer 32 and the damaged surface area A2 of the third semiconductor layer 34. It may be seen that the holes provided from the first area A1 of the second semiconductor layer 32 have a hole flow M2 flowing in a direction of the first area A1 of the electron blocking layer 35 through the first area A1 of the third semiconductor layer 34.

For example, by disposing the third semiconductor layer 34 having the lower doping concentration of the second conductivity-type dopant between the second semiconductor layer 32 and the electron blocking layer 35, the amount of holes provided from the second semiconductor layer 32 leaking into the damaged surface area A2 of the second semiconductor layer 32 or the damaged surface area A2 of the electron blocking layer 35 may be reduced. Accordingly, it may be seen that the holes are induced to flow from the first area A1 of the second semiconductor layer 32 and the third semiconductor layer 34 to the first area A1 of the electron blocking layer 35.

Referring to FIG. 5, (a-2) of FIG. 5 illustrates a schematic band diagram of the first area A1 and the damaged surface area A2_R of the second semiconductor layer 32 in the light emitting element core 30_R illustrated in (a-1) of FIG. 4 in which the third semiconductor layer 34 is omitted, and (b-2) of FIG. 5 illustrates a schematic band diagram of the first area A1 and the damaged surface area A2 of the third semiconductor layer 34 in the light emitting element core 30 illustrated in (b-1) of FIG. 4 in which the third semiconductor layer 34 is included. In the schematic band diagrams, an x-axis represents a position, and a y-axis represents band energy.

Referring to (a-2) and (b-2) of FIG. 5, a band energy difference e1 between the first area A1 and the damaged surface area A2_R of the second semiconductor layer 32 in the light emitting element core 30_R with the third semiconductor layer 34 omitted may be smaller than a band energy difference e2 between the first area A1 and the damaged surface area A2 of the third semiconductor layer 34 in the light emitting element core 30 including the third semiconductor layer 34.

Specifically, in the damaged surface area A2_R of the second semiconductor layer 32 of the light emitting element core 30_R with the third semiconductor layer 34 omitted, ionization of the second conductivity-type dopant may occur due to damage to the surface of the second semiconductor layer 32, and a valence band bending effect in which the band energy difference e1 between the damaged surface area A2_R and the first area A1 of the second semiconductor layer 32 is reduced may occur by the ionization of the second conductivity-type dopant in the damaged surface area AR_2 of the second semiconductor layer 32 as illustrated in (a-2) of FIG. 5. Accordingly, holes h+ provided from the second semiconductor layer 32 may readily flow from the first area A1 of the second semiconductor layer 32 to the damaged surface area A2_R of the second semiconductor layer 32.

The light emitting element core 30 according to an embodiment may include the third semiconductor layer 34 disposed between the second semiconductor layer 32 and the element active layer 33 and the third semiconductor layer 34 may be doped with the second conductivity-type dopant having the doping concentration lower than the defect density of the damaged surface area A2 of the light emitting element core 30 or the doping concentration having a range of $10^{18}/cm^3$ or less. As described above, in case that the third semiconductor layer 34 is doped with the second conductivity-type dopant having the doping concentration lower than the defect density of the damaged surface area A2 of the light emitting element core 30 or the doping concentration about $10^{18}/cm^3$ or less, a density of an ionized second conductivity-type dopant between the first area A1 of the third semiconductor layer 34 and the damaged surface area A2 of the third semiconductor layer 34, for example, an Mg ionized density difference may be large In case that a high concentration of ionized Mg is doped, the amount of holes h+ increases to alleviate band-bending caused by surface damage, but in case that the concentration of ionized Mg is lowered, the band-bending caused by surface damage may not be sufficiently alleviated. Accordingly, the band-bending or band energy difference e2 may increase between the first area A1 of the third semiconductor layer 34 and the damaged surface area A2 of the third semiconductor layer 34 by the Mg ionized density difference between the first area A1 that is the central portion of the third semiconductor layer 34 and the damaged surface area A2 of the third semiconductor layer 34. Therefore, it may be difficult for holes h+ provided from the second semiconductor layer 32 to flow from the first area A1 of the third semiconductor layer 34 to the damaged surface area A2 of the second semiconductor layer 32 or the third semiconductor layer 34. For example, a band-bending effect may occur between the first area A1 of the third semiconductor layer 34 and the damaged surface area A2 of the third semiconductor layer 34, such that it is possible to prevent holes h+ from being injected from the first area A1 of the light emitting element core 30 into the damaged surface area A2 of the light emitting element core 30.

Referring to FIG. 6, (a-3) of FIG. 6 illustrates a recombination rate contour map of the first area A1 and the damaged surface area A2_R of the electron blocking layer 35 in the light emitting element core 30_R illustrated in (a-1) of FIG. 4 with the third semiconductor layer 34 omitted, and (b-3) of FIG. 6 illustrates a recombination rate contour map of the first area A1 and the damaged surface area A2 of the electron blocking layer 35 in the light emitting element core 30 illustrated in (b-1) of FIG. 4.

Referring to (a-3) and (b-3) of FIG. 6, it may be seen that a recombination rate in the electron blocking layer 35 of the light emitting element core 30 including the third semiconductor layer 34 of (b-3) is reduced compared to a recombination rate in the electron blocking layer 35 of the light emitting element core 30_R with the third semiconductor layer 34 omitted as illustrated in (a-3). For example, by further disposing the third semiconductor layer 34, it may be seen that non-radiative recombination in the damaged surface area A2 of the light emitting element core 30 is reduced, and accordingly, light emitting efficiency of the light emitting element ED may be improved.

Figure 7:
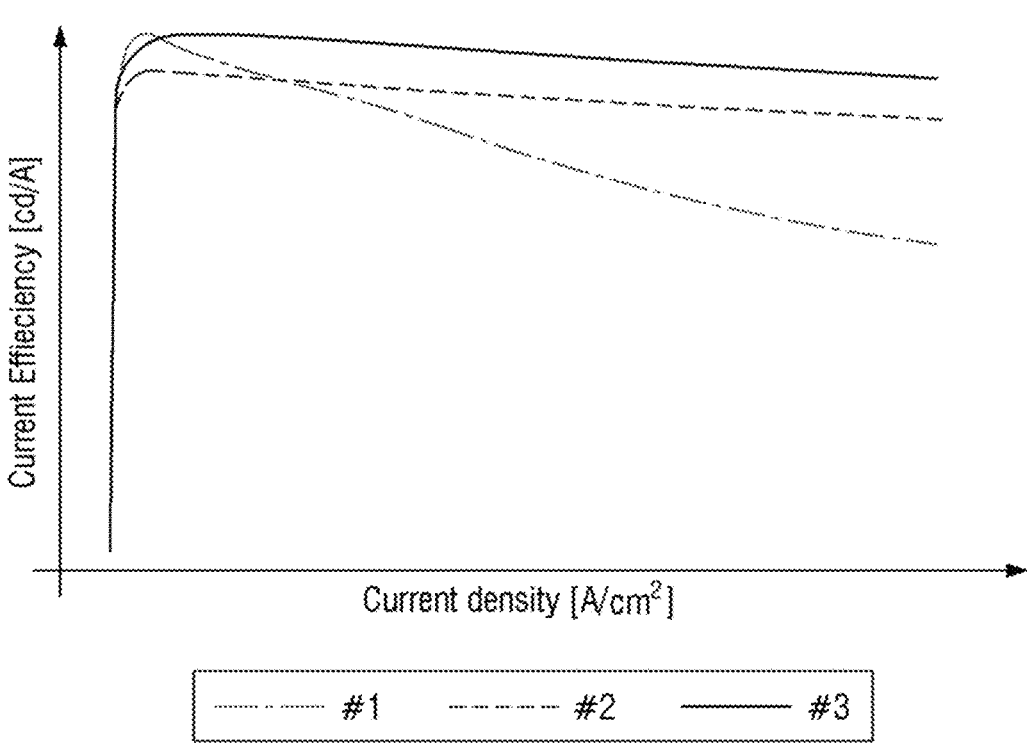
FIG. 7 is a graph comparing energy efficiencies according to light emitting element cores.

FIG. 7 is a graph comparing energy efficiencies between light emitting element cores.

FIG. 7 is a graph illustrating an efficiency of the light emitting element ED according to a current density. An x-axis of FIG. 7 may represent current density, and a y-axis thereof may represent efficiency of the light emitting element ED. #1 of FIG. 7 may be a light emitting element ED including a light emitting element core that does not include the third semiconductor layer 34, #2 of FIG. 7 may be a light emitting element ED including a light emitting element core including an electron blocking layer 35 having an aluminum composition of 15% or less, and #3 of FIG. 7 may be a light emitting element ED including a light emitting element core 30 including the electron blocking layer 35 having the aluminum composition of 15% or less and the third semiconductor layer 34.

Referring to #1 of FIG. 7, it may be seen that the efficiency of the light emitting element ED that does not include the third semiconductor layer 34 decreases as the current density increases. Referring to #2 of FIG. 7, it may be seen that a decrease in the efficiency of the light emitting element ED including the light emitting element core including the electron blocking layer 35 having the aluminum composition of 15% or less is reduced as the current density increases, but a maximum efficiency of the light emitting element is reduced. Referring to #3 of FIG. 7, it may be seen that a decrease in efficiency of the light emitting element ED including the light emitting element core 30 including the electron blocking layer 35 having the aluminum composition of 15% or less and the third semiconductor layer 34 is reduced and the maximum efficiency of the light emitting element is increased compared to that of the light emitting element of #2 of FIG. 7 as the current density increases.

Hereinafter, another embodiment of a light emitting element will be described. In the following embodiments, a description for the same configurations as those of the embodiment described above will be omitted or simplified and configurations different from those of the embodiment described above will be described.

Figure 8:
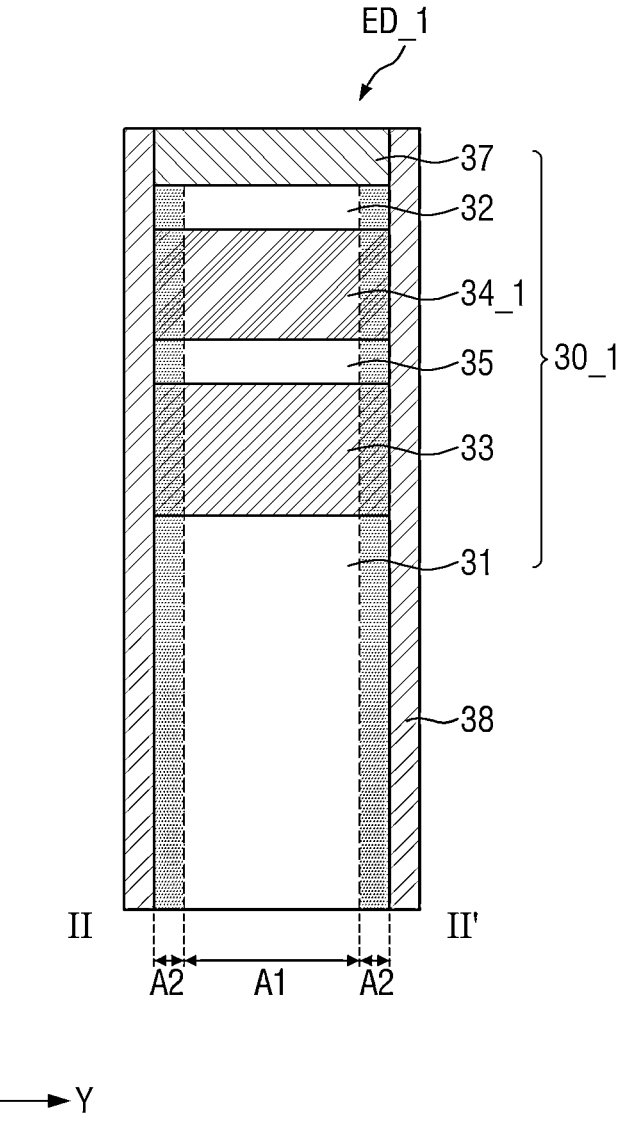
FIG. 8 is a schematic cross-sectional view of a light emitting element illustrating an embodiment taken along line I-I' of FIG. 1.

FIG. 8 is a schematic cross-sectional view of a light emitting element illustrating an embodiment taken along line I-I' of FIG. 1.

A light emitting element ED_1 according to the embodiment is different from the embodiment of FIG. 2 in that it includes a light emitting element core 30_1 including a third semiconductor layer 34_1 undoped with a conductivity-type dopant.

Specifically, the third semiconductor layer 34_1 may include an undoped semiconductor. The third semiconductor layer 34_1 may include substantially the same material as the second semiconductor layer 32, but may include a material that is not doped with a second conductivity-type dopant.

In the embodiment, as the third semiconductor layer 34_1 includes substantially the same material as the second semiconductor layer 32, but is not doped with the conductivity-type dopant, a band bending effect may occur at an interface between a first area A1 of the third semiconductor layer 34_1 and a damaged surface area A2 of the third semiconductor layer 34_1. Accordingly, it is possible to prevent the holes provided from the second semiconductor layer 32 from leaking into the damaged surface area A2, and the holes provided from the second semiconductor layer 32 may be induced to flow in the first area A1 of the light emitting element core 30 in which no defect has occurred. Accordingly, non-radiative recombination in the damaged surface area A2 of the light emitting element core 30 may be reduced, so that light emitting efficiency of the light emitting element may be improved.

Figure 9:
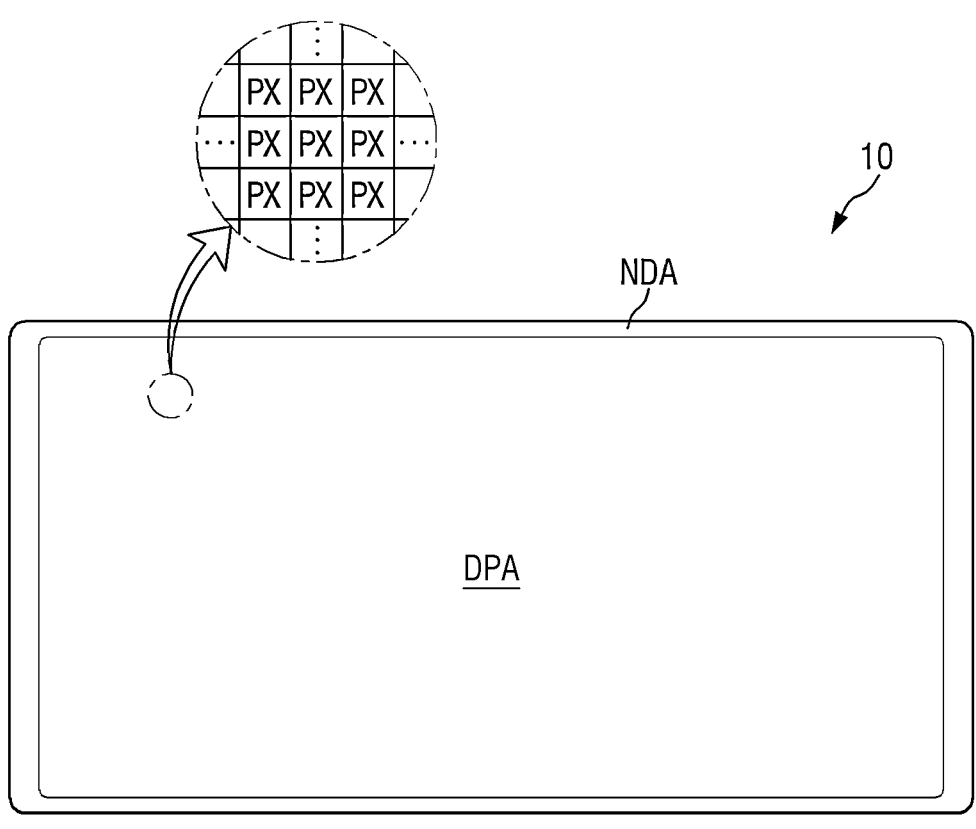
FIG. 9 is a plan view of a display device according to an embodiment.
Figure 9:
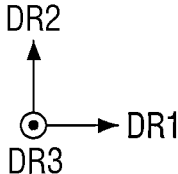

FIG. 9 is a plan view of a display device according to an embodiment.

Referring to FIG. 9, a display device 10 displays a moving image or a still image. The display device 10 may refer to all electronic devices that provide display screens. For example, televisions, laptop computers, monitors, billboards, Internet of Things (IoT), mobile phones, smartphones, tablet personal computers (PCs), electronic watches, smartwatches, watch phones, head mounted displays, mobile communication terminals, electronic organizers, electronic books, portable multimedia players (PMPs), navigation devices, game machines, digital cameras, camcorders, and the like, that provide display screens may be included in the display device 10.

The display device 10 may include a display panel providing a display screen. Examples of the display panel may include an inorganic light emitting diode display panel, an organic light emitting display panel, a quantum dot light emitting display panel, a plasma display panel, a field emission display panel, and the like. Hereinafter, a case where the above-described light emitting element ED, specifically, the inorganic light emitting diode display panel is applied as an embodiment of the display panel will be described by way of example, but the disclosure is not limited thereto, and the same technical idea may be applied to other display panels if applicable.

Hereinafter, in the drawings of an embodiment for describing the display device 10, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are positioned. The third direction DR3 is perpendicular to each of the first direction DR1 and the second direction DR2. In embodiments for describing the display device 10, the third direction DR3 refers to a thickness direction of the display device 10.

The display device 10 may have a rectangular shape including a long side and a short side in which the first direction DR1 is longer than the second direction DR2 in a plan view. A corner portion where the long side and the short side of the display device 10 meet in a plan view may be right-angled, but is not limited thereto, and may have a rounded curved shape. The shape of the display device 10 in a plan view is not limited to that described above, and may be other shapes such as a square shape, a quadrangular shape with rounded corners (vertices), other polygonal shapes, and a circular shape.

A display surface of the display device 10 may be disposed on one side in the third direction DR3, which is the thickness direction. In embodiments for describing the display device 10, unless otherwise stated, "upper portion" refers to a display direction as a side in the third direction DR3, and "upper surface" refers to a surface facing one side in the third direction DR3. "Lower portion" refers to a direction opposite to the display direction as another side in the third direction DR3, and "lower surface" refers to a surface facing the other side in the third direction DR3. "left", "right", "upper", and "lower" refer to directions in case that the display device 10 is viewed in a plan view. For example, "right side" refers to a side in the first direction DR1, "left side" refers to another side in the first direction DR1, "upper side" refers to a side in the second direction DR2, and "lower side" refers to another side in the second direction DR2.

The display device 10 may include a display area DPA and a non-display area NDA. The display area DPA may be an area in which a screen is displayed, and the non-display area NDA may be an area in which a screen is not displayed.

A shape of the display area DPA may follow the shape of the display device 10. For example, the shape of the display area DPA may have a rectangular shape in a plan view, similar to the overall shape of the display device 10. The display area DPA may occupy substantially the center of the display device 10.

The display area DPA may include multiple pixels PX. The multiple pixels PX may be arranged in a matrix direction. A shape of each pixel PX may be a rectangular or square shape in a plan view. However, the disclosure is not limited thereto, and the shape of each pixel PX may be a rhombic shape in which each side is inclined with respect to one direction. Each pixel PX may be alternately arranged in a stripe type or a Pentile® type.

The non-display area NDA may be disposed around the display area DPA. The non-display area NDA may completely or partially surround the display area DPA. In an embodiment, the display area DPA may have a rectangular shape, and the non-display area NDA may be disposed adjacent to four sides of the display area DPA. The non-display area NDA may constitute a bezel of the display device 10. Wirings, circuit drivers, or a pad portion on which an external device is mounted, which are included in the display device 10, may be disposed in the non-display area NDA.

Figure 10:
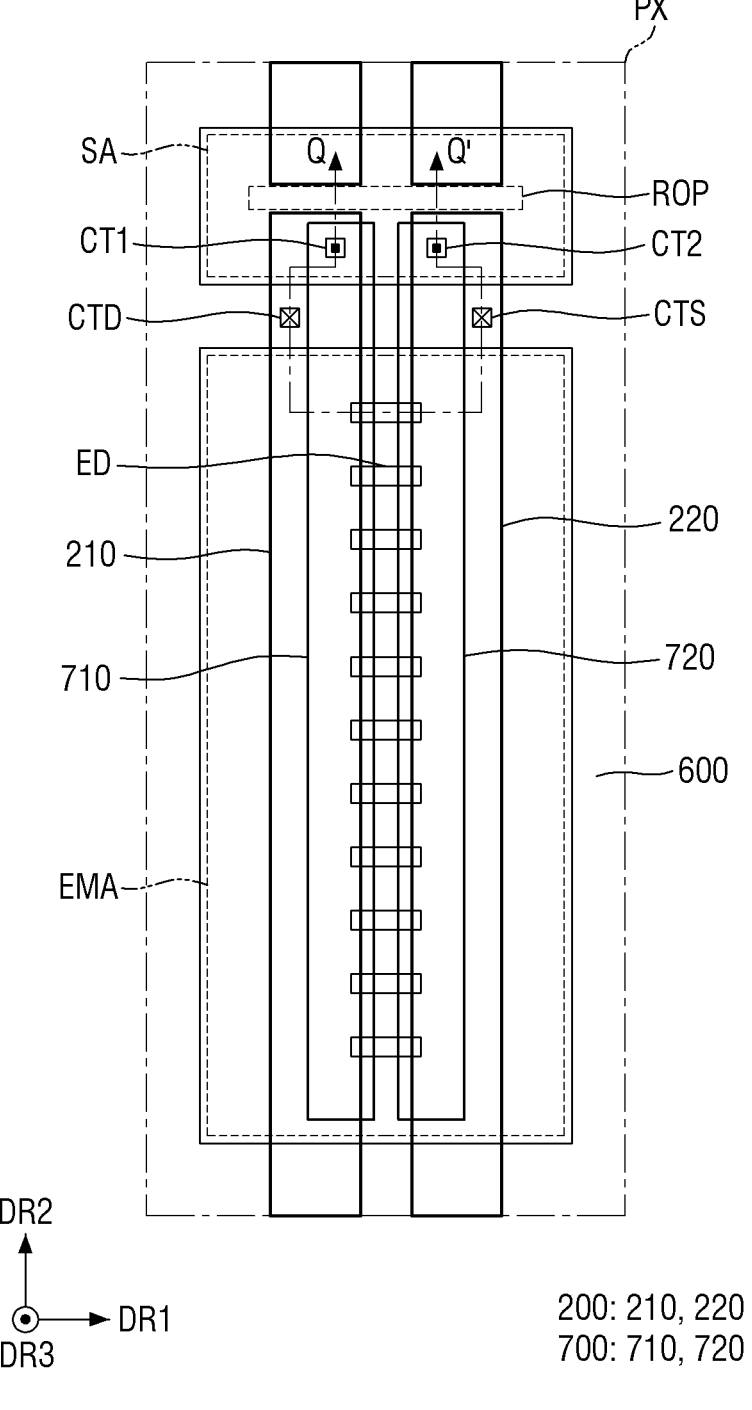
FIG. 10 is a plan layout view illustrating a pixel of a display device according to an embodiment.
Figure 11:
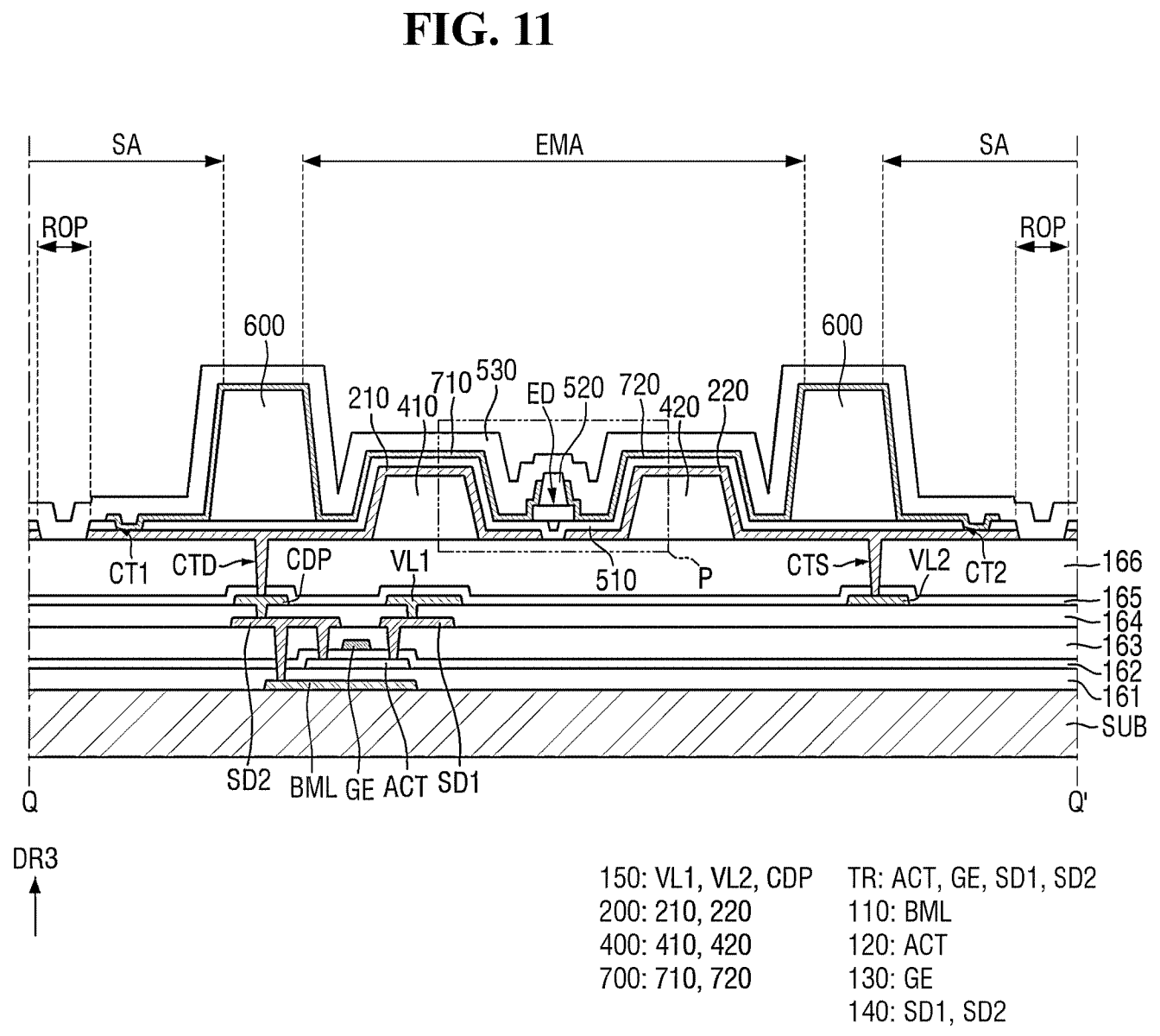

FIG. 10 is a plan layout view illustrating a pixel of a display device according to an embodiment. FIG. 11 is a schematic cross-sectional view illustrating an embodiment taken along line Q-Q' of FIG. 10.

Referring to FIG. 10, each pixel PX of the display device 10 may include an emission area EMA and a non-emission area. The emission area EMA may be an area from which the light emitted from the light emitting element ED is emitted, and the non-emission area may be defined as an area where light emitted from the light emitting element ED does not reach and thus does not emit light.

The emission area EMA may include an area in which the light emitting elements ED are disposed and an area adjacent thereto. The emission area may further include an area in which the light emitted from the light emitting elements ED is reflected or refracted by other members and then emitted.

Each pixel PX may further include a sub-area SA disposed in the non-emission area. The light emitting elements ED may not be disposed in the sub-area SA. The sub-area SA may be disposed on an upper side of the emission area EMA in a plan view in a pixel PX. The sub-area SA may be disposed between emission areas EMA of pixels PXs neighboring each other in the second direction DR2. The sub-area SA may include an area in which an electrode layer 200 and a contact electrode 700 are electrically connected to each other through contact portions CT1 and CT2.

The sub-area SA may include a separation portion ROP. The separation portion ROP of the sub-area SA may be an area in which a first electrode 210 and a second electrode 220 included in the electrode layer 200 included in each pixel PX adjacent to each other along the second direction DR2 are separated from each other.

Referring to FIGS. 10 and 11, the display device 10 may include a substrate SUB, a circuit element layer disposed on the substrate SUB, and a light emitting element layer disposed on the circuit element layer.

The substrate SUB may be an insulating substrate. The substrate SUB may be made of an insulating material such as glass, quartz, or a polymer resin. The substrate SUB may be a rigid substrate, but may also be a flexible substrate that may be bent, folded, or rolled.

The circuit element layer may be disposed on the substrate SUB. The circuit element layer may include a lower metal layer 110, a semiconductor layer 120, a first conductive layer 130, a second conductive layer 140, a third conductive layer 150, and multiple insulating films.

The lower metal layer 110 may be disposed on the substrate SUB. The lower metal layer 110 may include a light blocking pattern BML. The light blocking pattern BML, may be disposed below an active layer ACT of a transistor TR so as to cover at least a channel area of the active layer ACT of the transistor TR. However, the light blocking pattern BML is not limited thereto and may be omitted.

The lower metal layer 110 may include a material that blocks light. For example, the lower metal layer 110 may be formed of an opaque metal material that blocks transmission of the light.

A buffer layer 161 may be disposed on the lower metal layer 110. The buffer layer 161 may be disposed to cover the entire surface of the substrate SUB on which the lower metal layer 110 is disposed. The buffer layer 161 may serve to protect multiple transistors from moisture permeating through the substrate SUB vulnerable to moisture permeation.

The semiconductor layer 120 may be disposed on the buffer layer 161. The semiconductor layer 120 may include the active layer ACT of the transistor TR. The active layer ACT of the transistor TR may be disposed to overlap the light blocking pattern BML of the lower metal layer 110, as described above.

The semiconductor layer 120 may include polycrystalline silicon, single crystal silicon, an oxide semiconductor, or the like. In an embodiment, in case that the semiconductor layer 120 includes the polycrystalline silicon, the polycrystalline silicon may be formed by crystallizing amorphous silicon. In case that the semiconductor layer 120 includes the polycrystalline silicon, the active layer ACT of the transistor TR may include multiple doped areas doped with impurities and a channel area between the multiple doped areas. In an embodiment, the semiconductor layer 120 may include an oxide semiconductor. The oxide semiconductor may be, for example, indium-tin oxide (ITO), indium-zinc oxide (IZO), indium-gallium oxide (IGO), indium-zinc-tin Oxide (IZTO), indium-gallium-zinc oxide (IGZO), indium-gallium-tin oxide (IGTO), indium-gallium-zinc-tin oxide (IGZTO), or the like.

A gate insulating film 162 may be disposed on the semiconductor layer 120. The gate insulating layer 162 may function as a gate insulating film of the transistor. The gate insulating layer 162 may be formed as a multiple layer in which inorganic layers including an inorganic material, for example, silicon oxide ($SiO_x$), silicon nitride ($SiN_x$), or silicon oxynitride ($SiO_xN_y$) are alternately stacked each other.

The first conductive layer 130 may be disposed on the gate insulating layer 162. The first conductive layer 130 may include a gate electrode GE of the transistor TR. The gate electrode GE may be disposed to overlap the channel area of the active layer ACT in the third direction DR3, which is the thickness direction of the substrate SUB.

A first interlayer insulating film 163 may be disposed on the first conductive layer 130. The first interlayer insulating film 163 may be disposed to cover the gate electrode GE. The first interlayer insulating film 163 may function as an insulating film between the first conductive layer 130 and other layers disposed on the first conductive layer 130, and may protect the first conductive layer 130.

The second conductive layer 140 may be disposed on the first interlayer insulating film 163. The second conductive layer 140 may include a drain electrode SD1 of the transistor TR and a source electrode SD2 of the transistor TR.

The drain electrode SD1 and the source electrode SD2 of the transistor TR may be electrically connected to both end areas of the active layer ACT of the transistor TR through contact holes penetrating the first interlayer insulating film 163 and the gate insulating film 162, respectively. The source electrode SD2 of the transistor TR may be electrically connected to the light blocking pattern BML, of the lower metal layer 110 through another contact hole penetrating the first interlayer insulating film 163, the gate insulating film 162, and the buffer layer 161.

A second interlayer insulating film 164 may be disposed on the second conductive layer 140. The second interlayer insulating film 164 may be disposed to cover the drain electrode SD1 of the transistor TR and the source electrode SD2 of the transistor TR. The second interlayer insulating film 164 may function as an insulating film between the second conductive layer 140 and other layers disposed on the second conductive layer 140, and may protect the second conductive layer 140.

The third conductive layer 150 may be disposed on the second interlayer insulating film 164. The third conductive layer 150 may include a first voltage line VL1, a second voltage line VL2, and a conductive pattern CDP.

The first voltage line VL1 may overlap at least a portion of the drain electrode SD1 of the transistor TR in the thickness direction of the substrate SUB. A high potential voltage (or a first source voltage) supplied to the transistor TR may be applied to the first voltage line VL1.

The second voltage line VL2 may be electrically connected to the second electrode 220 through a second electrode contact hole CTS penetrating a via layer 166 and a passivation layer 165 to be described later. A low potential voltage (or a second power voltage) lower than the high potential voltage supplied to the first voltage line VL1 may be applied to the second voltage line VL2. For example, the high potential voltage (or the first source voltage) supplied to the transistor TR may be applied to the first voltage line VL1, and the low potential voltage (or the second source voltage) lower than the high potential voltage supplied to the first voltage line VL1 may be applied to the second voltage line VL2.

The conductive pattern CDP may be electrically connected to the source electrode SD2 of the transistor TR. The conductive pattern CDP may be electrically connected to the source electrode SD2 of the transistor TR through a contact hole penetrating the second interlayer insulating film 164. The conductive pattern CDP may be electrically connected to the first electrode 210 through a first electrode contact hole CTD penetrating the via layer 166 and the passivation layer 165 to be described later. The transistor TR may transfer the first source voltage applied from the first voltage line VL1 to the first electrode 210 through the conductive pattern CDP.

A passivation layer 165 may be disposed on the third conductive layer 150. The passivation layer 165 may be disposed to cover the third conductive layer 150. The passivation layer 165 may serve to protect the third conductive layer 150.

Each of the buffer layer 161, the gate insulating film 162, the first interlayer insulating film 163, the second interlayer insulating film 164, and the passivation layer 165 may be formed of multiple inorganic layers alternately stacked each other. For example, each of the buffer layer 161, the gate insulating film 162, the first interlayer insulating film 163, the second interlayer insulating film 164, and the passivation layer 165 may be formed as a double layer in which inorganic layers including at least one of silicon oxide ($SiO_x$), silicon nitride ($SiN_x$), and silicon oxynitride ($SiO_xN_y$) are stacked each other or multiple layers in which these layers are alternately stacked each other. However, the disclosure is not limited thereto, and each of the buffer layer 161, the gate insulating film 162, the first interlayer insulating film 163, the second interlayer insulating film 164, and the passivation layer 165 may also be formed as a single inorganic layer including the insulating material described above.

The via layer 166 may be disposed on the passivation layer 165. The via layer 166 may include an organic insulating material, for example, an organic material such as polyimide (PI). The via layer 166 may perform a function of planarizing a surface. Accordingly, an upper surface (or surface) of the via layer 166 on which a light emitting element layer, which will be described later, is disposed, may have a generally flat surface regardless of a shape or presence of a pattern disposed on a lower side thereof.

The light emitting element layer may be disposed on the circuit element layer. The light emitting element layer may be disposed on the via layer 166. The light emitting element layer may include a first bank 400, an electrode layer 200, a first insulating layer 510, a second bank 600, multiple light emitting elements ED, and a contact electrode 700.

The first bank 400 may be disposed on the via layer 166 in the emission area EMA. The first bank 400 may be directly disposed on a surface of the via layer 166. The first bank 400 may have a structure in which at least a portion thereof protrudes upward (e.g., toward one side in the third direction DR3) with respect to the surface of the via layer 166. The protruding portion of the first bank 400 may have inclined side surfaces. The first bank 400 may have the inclined side surfaces to serve to change a traveling direction of light emitted from the light emitting elements ED so that the light traveling toward the side surfaces of the first bank 400 may reflect to an upper direction (e.g., a display direction).

The first bank 400 may include a first sub-bank 410 and a second sub-bank 420 spaced apart from each other. The first sub-bank 410 and the second sub-bank 420 spaced apart from each other may provide a space in which the light emitting elements ED are disposed and also assist in the role of reflective partitions that change the traveling direction of the light emitted from the light emitting elements ED to the display direction.

It has been illustrated in the drawings that the side surfaces of the first bank 400 are inclined in a linear shape, but the disclosure is not limited thereto. For example, the side surfaces (or outer surfaces) of the first bank 400 may have a curved semicircular or semielliptical shape. In an embodiment, the first bank 400 may include an organic insulating material such as polyimide (PI), but is not limited thereto.

The electrode layer 200 may have a shape extending in one direction and may be disposed throughout the emission area EMA and the sub-area SA. The electrode layer 200 may transmit an electric signal applied from the circuit element layer to the light emitting element ED to emit light. The electrode layer 200 may be used to generate an electric field used in an alignment process of the multiple light emitting elements ED.

The electrode layer 200 may be disposed on the first bank 400 and the via layer 166 exposed by the first bank 400. In the emission area EMA, the electrode layer 200 may be disposed on the first bank 400, and in the non-emission area, the electrode layer 200 may be disposed on the via layer 166 exposed by the first bank 400.

The electrode layer 200 may include a first electrode 210 and a second electrode 220. The first electrode 210 and the second electrode 220 may be spaced apart from each other.

The first electrode 210 may be disposed on the left side of each pixel PX in a plan view. The first electrode 210 may have a shape extending in the second direction DR2 in a plan view. The first electrode 210 may be disposed throughout the emission area EMA and the sub-area SA. The first electrode 210 may extend in the second direction DR2 in a plan view, and may be separated from the first electrode 210 of the neighboring pixel PX in the second direction DR2 in the separation portion ROP of the sub-area SA.

The second electrode 220 may be spaced apart from the first electrode 210 in the first direction DR1. The second electrode 220 may be disposed on the right side of each pixel PX in a plan view. The second electrode 220 may have a shape extending in the second direction DR2 in a plan view. The second electrode 220 may be disposed to cross the emission area EMA and the sub-area SA. The second electrode 220 may extend in the second direction DR2 in a plan view, and may be separated from the second electrode 220 of the neighboring pixel PX in the second direction DR2 in the separation portion ROP of the sub-area SA.

Specifically, in the emission area EMA, the first electrode 210 may be disposed on the first sub-bank 410, and the second electrode 220 may be disposed on the second sub-bank 420. The first electrode 210 may extend outwardly from the first sub-bank 410 and may also be disposed on the via layer 166 exposed by the first sub-bank 410. Similarly, the second electrode 220 may extend outwardly from the second sub-bank 420 and may also be disposed on the via layer 166 exposed by the second sub-bank 420. The first electrode 210 and the second electrode 220 may be spaced apart from each other and may face each other in a spaced area between the first sub-bank 410 and the second sub-bank 420. The via layer 166 may be exposed in an area where the first electrode 210 and the second electrode 220 are spaced apart from each other and face each other.

The first electrode 210 may be spaced apart from a first electrode 210 of another pixel PX adjacent in the second direction DR2 with the separation portion ROP interposed therebetween in the sub-area SA. Similarly, the second electrode 220 may be spaced apart from a second electrode 220 of another pixel PX adjacent in the second direction DR2 with the separation portion ROP interposed therebetween in the sub-area SA. Accordingly, the first electrode 210 and the second electrode 220 may expose the via layer 166 in the separation portion ROP of the sub-area SA.

The first electrode 210 may be electrically connected to the conductive pattern CDP of the circuit element layer through the first electrode contact hole CTD penetrating the via layer 166 and the passivation layer 165. Specifically, the first electrode 210 may be in contact with an upper surface of the conductive pattern CDP exposed by the first electrode contact hole CTD. The first source voltage applied from the first voltage line VL1 may be transferred to the first electrode 210 through the conductive pattern CDP.

The second electrode 220 may be electrically connected to the second voltage line VL2 of the circuit element layer through the second electrode contact hole CTS penetrating the via layer 166 and the passivation layer 165. Specifically, the second electrode 220 may be in contact with an upper surface of the second voltage line VL2 exposed by the second electrode contact hole CTS. The second source voltage applied from the second voltage line VL2 may be transferred to the second electrode 220.

The electrode layer 200 may include a conductive material having high reflectivity. For example, the electrode layer 200 may include a metal such as silver (Ag), copper (Cu), aluminum (Al), or the like, or include an alloy including aluminum (Al), nickel (Ni), lanthanum (La), or the like, as the material having the high reflectivity. The electrode layer 200 may reflect the light emitted from the light emitting element ED so that the light traveling toward the side surfaces of the first bank 400 may reflect to an upper direction of each pixel PX.

However, the disclosure is not limited thereto, and the electrode layer 200 may include a transparent conductive material. For example, the electrode layer 200 may include a material such as ITO, IZO, or ITZO. In the embodiments, the electrode layer 200 may have a structure in which one or more layers made of the transparent conductive material and one or more layers made of the metal having the high reflectivity are stacked each other or may be formed as one layer including the transparent conductive material and the metal having the high reflectivity. For example, the electrode layer 200 may have a stacked structure such as ITO/Ag/ITO, ITO/Ag/IZO, or ITO/Ag/ITZO/IZO.

The first insulating layer 510 may be disposed on the via layer 166 on which the electrode layer 200 is formed. The first insulating layer 510 may protect the electrode layer 200 and may insulate the first electrode 210 and the second electrode 220 from each other.

The first insulating layer 510 may include an inorganic insulating material. For example, the first insulating layer 510 may include at least one of an inorganic insulating material such as silicon oxide (SiO$_x$), silicon nitride (SiN$_x$), silicon oxynitride (SiO$_x$N$_y$), aluminum oxide (Al$_x$O$_y$), and aluminum nitride (AlN). The first insulating layer 510 made of the inorganic material may have a surface shape reflecting a pattern shape of the electrode layer 200 disposed below. For example, the first insulating layer 510 may have a stepped structure according to the shape of the electrode layer 200 disposed below the first insulating layer 510. Specifically, the first insulating layer 510 may include a stepped structure in which a portion of the upper surface thereof is recessed in an area where the first electrode 210 and the second electrode 220 are spaced apart from each other and face each other. Therefore, a height of the upper surface of the first insulating layer 510 disposed on an upper portion of the first electrode 210 and an upper portion of the second electrode 220 may be higher than a height of the upper surface of the first insulating layer 510 disposed on the via layer 166 in which the first electrode 210 and the second electrode 220 are not disposed. In the specification, a height of an upper surface of any layer may be relatively compared with a height measured from a flat reference surface (e.g., the upper surface of the via layer 166) without a lower stepped structure.

The first insulating layer 510 may include a first contact portion CT1 exposing a portion of the upper surface of the first electrode 210 and a second contact portion CT2 exposing a portion of the upper surface of the second electrode 220 in the sub-area SA. The first electrode 210 may be electrically connected to a first contact electrode 710 to be described later through the first contact portion CT1 penetrating the first insulating layer 510 in the sub-area SA, and the second electrode 220 may be electrically connected to a second contact electrode 720 to be described later through the second contact portion CT2 penetrating the first insulating layer 510 in the sub-area SA.

The second bank 600 may be disposed on the first insulating layer 510. The second bank 600 may be disposed in a lattice pattern by including portions extending in the first direction DR1 and the second direction DR2 in a plan view.

The second bank 600 may be disposed across boundaries between the adjacent pixels PX to divide neighboring pixels PX, and may divide the emission area EMA and the sub-area SA. The second bank 600 may be formed to have a greater height than the first bank 400 to allow ink in which the multiple light emitting elements ED are dispersed to be sprayed into the emission area EMA without being mixed into the adjacent pixels PX in an inkjet printing process for aligning the light emitting elements ED of the process of manufacturing the display device 10.

The multiple light emitting elements ED may be disposed in the emission area EMA. The multiple light emitting elements ED may not be disposed in the sub-area SA.

The multiple light emitting elements ED may be disposed on the first insulating layer 510 between the first sub-bank 410 and the second sub-bank 420. The multiple light emitting elements ED may be disposed between the first electrode 210 and the second electrode 220 on the first insulating layer 510.

The light emitting element ED may have a shape extending in one direction, and may be disposed so that both ends thereof are placed on the first electrode 210 and the second electrode 220, respectively. For example, the multiple light emitting elements ED may be disposed so that one end of the light emitting element ED is placed on the first electrode 210 and another end of the light emitting element ED is placed on the second electrode 220.

A length of each light emitting element ED (i.e., a length of the light emitting element ED in the first direction DR1 in the drawing) may be smaller than the shortest distance between the first sub-bank 410 and the second sub-bank 420 spaced apart from each other in the first direction DR1. The length of each light emitting element ED may be greater than the shortest distance between the first electrode 210 and the second electrode 220 spaced apart from each other in the first direction DR1. As the distance between the first sub-bank 410 and the second sub-bank 420 in the first direction DR1 is formed to be longer than the length of each light emitting element ED, and the distance between the first electrode 210 and the second electrode 220 in the first direction DR1 is formed to be shorter than the length of each light emitting element ED, the multiple light emitting elements ED may be disposed so that both ends of the multiple light emitting elements ED are placed on the first electrode 210 and the second electrode 220 in the area between the first sub-bank 410 and the second sub-bank 420, respectively.

The multiple light emitting elements ED may be spaced apart from each other along the second direction DR2 in which the first electrode 210 and the second electrode 220 extend, and may be aligned substantially parallel to each other.

The second insulating layer 520 may be disposed on the light emitting element ED. The second insulating layer 520 may be disposed on a part of the light emitting element ED to expose both ends of the light emitting element ED. The second insulating layer 520 may be disposed to partially cover the outer surface of the light emitting element ED so as not to cover one end and the other end of the light emitting element ED.

A portion of the second insulating layer 520 disposed on the light emitting element ED may be disposed to extend in the second direction DR2 on the first insulating layer 510 in a plan view to form a linear or island-shaped pattern in each pixel PX. The second insulating layer 520 may protect the light emitting element ED and may fix the light emitting element ED in the process of manufacturing the display device 10. The second insulating layer 520 may be disposed to fill a spaced space between the light emitting element ED and the first insulating layer 510 on the lower side of the light emitting element ED.

The contact electrode 700 may be disposed on the second insulating layer 520. The contact electrode 700 may be disposed on the first insulating layer 510 on which the light emitting element ED is disposed. The contact electrode 700 may include a first contact electrode 710 and a second contact electrode 720 spaced apart from each other.

The first contact electrode 710 may be disposed on the first electrode 210 in the emission area EMA. The first contact electrode 710 may have a shape extending in the second direction DR2 on the first electrode 210. The first contact electrode 710 may be in contact with each of the first electrode 210 and an end of the light emitting element ED.

The first contact electrode 710 may be in contact with the first electrode 210 exposed by the first contact portion CT1 penetrating the first insulating layer 510 in the sub-area SA, and may be in contact with an end of the light emitting element ED in the emission area EMA. For example, the first contact electrode 710 may serve to electrically connect the first electrode 210 and an end of the light emitting element ED to each other.

The second contact electrode 720 may be disposed on the second electrode 220 in the emission area EMA. The second contact electrode 720 may have a shape extending in the second direction DR2 on the second electrode 220. The second contact electrode 720 may be in contact with each of the second electrode 220 and another end of the light emitting element ED.

The second contact electrode 720 may be in contact with the second electrode 220 exposed by the second contact portion CT2 penetrating the first insulating layer 510 in the sub-area SA, and may be in contact with the other end of the light emitting element ED in the emission area EMA. For example, the second contact electrode 720 may serve to electrically connect the second electrode 220 and the other end of the light emitting element ED to each other.

The first contact electrode 710 and the second contact electrode 720 may be spaced apart from each other on the light emitting element ED. Specifically, the first contact electrode 710 and the second contact electrode 720 may be spaced apart from each other with the second insulating layer 520 interposed therebetween. The first contact electrode 710 and the second contact electrode 720 may be electrically insulated from each other.

The first contact electrode 710 and the second contact electrode 720 may include a same material. For example, each of the first contact electrode 710 and the second contact electrode 720 may include a conductive material. For example, the first contact electrode 710 and the second contact electrode 720 may include ITO, IZO, ITZO, aluminum (Al), or the like. For example, each of the first contact electrode 710 and the second contact electrode 720 may include a transparent conductive material. As each of the first contact electrode 710 and the second contact electrode 720 includes the transparent conductive material, the light emitted from the light emitting element ED may transmit through the first contact electrode 710 and the second contact electrode 720 to travel toward the first electrode 210 and the second electrode 220, and may be reflected from surfaces of the first electrode 210 and the second electrode 220.

The first contact electrode 710 and the second contact electrode 720 may include a same material and may be formed as a same layer. The first contact electrode 710 and the second contact electrode 720 may be simultaneously formed by a same process.

A third insulating layer 530 may be disposed on the contact electrode 700. The third insulating layer 530 may cover the light emitting element layer disposed below. The third insulating layer 530 may cover the first bank 400, the electrode layer 200, the first insulating layer 510, the multiple light emitting elements ED, and the contact electrode 700. The third insulating layer 530 may be disposed on the second bank 600 to cover the second bank 600.

The third insulating layer 530 may serve to protect the light emitting element layer disposed below from foreign substances such as moisture, oxygen or particles of dust. The third insulating layer 530 may serve to protect the first bank 400, the electrode layer 200, the first insulating layer 510, the multiple light emitting elements ED, and the contact electrode 700.

Figure 12:
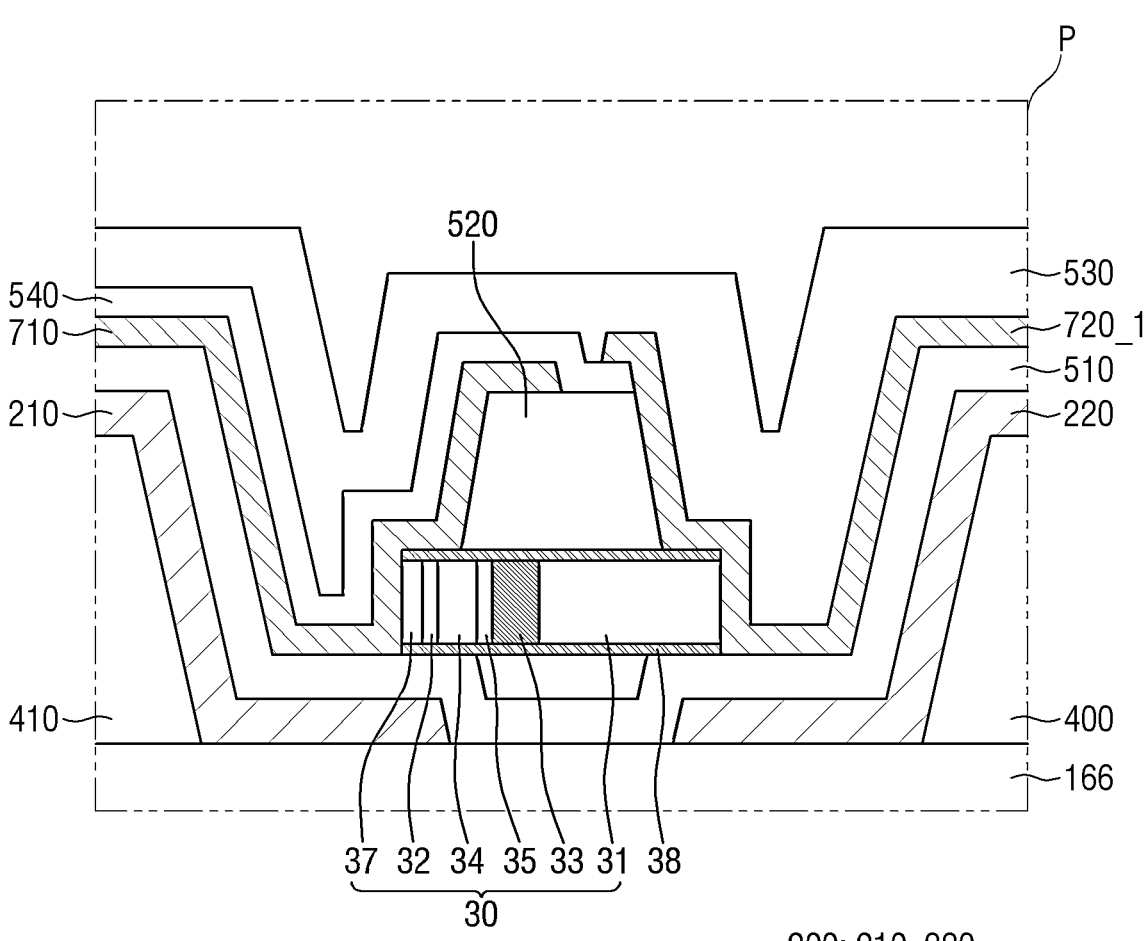
FIG. 12 is a schematic enlarged cross-sectional view illustrating an embodiment of area P of FIG. 11.

FIG. 12 is a schematic enlarged cross-sectional view illustrating an embodiment of area P of FIG. 11.

Referring to FIG. 12, the light emitting element ED may be disposed so that an extension direction of the light emitting element ED is parallel to a surface of the substrate SUB. The multiple semiconductor layers included in the light emitting element ED may be sequentially disposed along a direction parallel to the upper surface of the substrate SUB (or the upper surface of the via layer 166). For example, the first semiconductor layer 31, the element active layer 33, the electron blocking layer 35, the third semiconductor layer 34, and the second semiconductor layer 32 of the light emitting element ED may be sequentially disposed to be parallel to the upper surface of the substrate SUB.

Specifically, in the light emitting element ED, the first semiconductor layer 31, the element active layer 33, the electron blocking layer 35, the third semiconductor layer 34, the second semiconductor layer 32, and the element electrode layer 37 may be sequentially formed on a cross-section crossing both ends of the light emitting element ED in a direction parallel to the upper surface of the substrate SUB.

The light emitting element ED may be disposed so that an end thereof is placed on the first electrode 210 and another end thereof is placed on the second electrode 220. However, the disclosure is not limited thereto, and the light emitting element ED may also be disposed so that an end thereof is placed on the second electrode 220 and the other end thereof is placed on the first electrode 210.

The second insulating layer 520 may be disposed on the light emitting element ED. The second insulating layer 520 may be disposed to surround an outer surface of the light emitting element ED. The second insulating layer 520 may be disposed on the element insulating layer 38 of the light emitting element ED and may surround an outer surface of the element insulating layer 38 of the light emitting element ED facing the display direction DR3.

In an area in which the light emitting element ED is disposed, the second insulating layer 520 may be disposed to surround the outer surface of the light emitting element ED (specifically, the element insulating layer 38 of the light emitting element ED), and in an area in which the light emitting element ED is not disposed, the second insulating layer 520 may be disposed on the first insulating layer 510 exposed by the light emitting element ED.

The first contact electrode 710 may be in contact with an end of the light emitting element ED exposed by the second insulating layer 520. Specifically, the first contact electrode 710 may be disposed to surround an end surface of the light emitting element ED exposed by the second insulating layer 520. The first contact electrode 710 may be in contact with the element insulating layer 38 and the element electrode layer 37 of the light emitting element ED.

The second contact electrode 720 may be in contact with another end of the light emitting element ED exposed by the second insulating layer 520. Specifically, the second contact electrode 720 may be disposed to surround the other end surface of the light emitting element ED exposed by the second insulating layer 520. The second contact electrode 720 may be in contact with the element insulating layer 38 and the first semiconductor layer 31 of the light emitting element ED.

The first contact electrode 710 and the second contact electrode 720 may be spaced apart from each other with the second insulating layer 520 interposed therebetween. The first contact electrode 710 and the second contact electrode 720 may expose at least a portion of the upper surface of the second insulating layer 520.

The first contact electrode 710 and the second contact electrode 720 may be formed on a same layer and may include a same material. For example, the first contact electrode 710 and the second contact electrode 720 may be simultaneously formed by a mask process. Accordingly, since an additional mask process for forming the first contact electrode 710 and the second contact electrode 720 is not required, an efficiency of the process of manufacturing the display device 10 may be improved.

Figure 13:
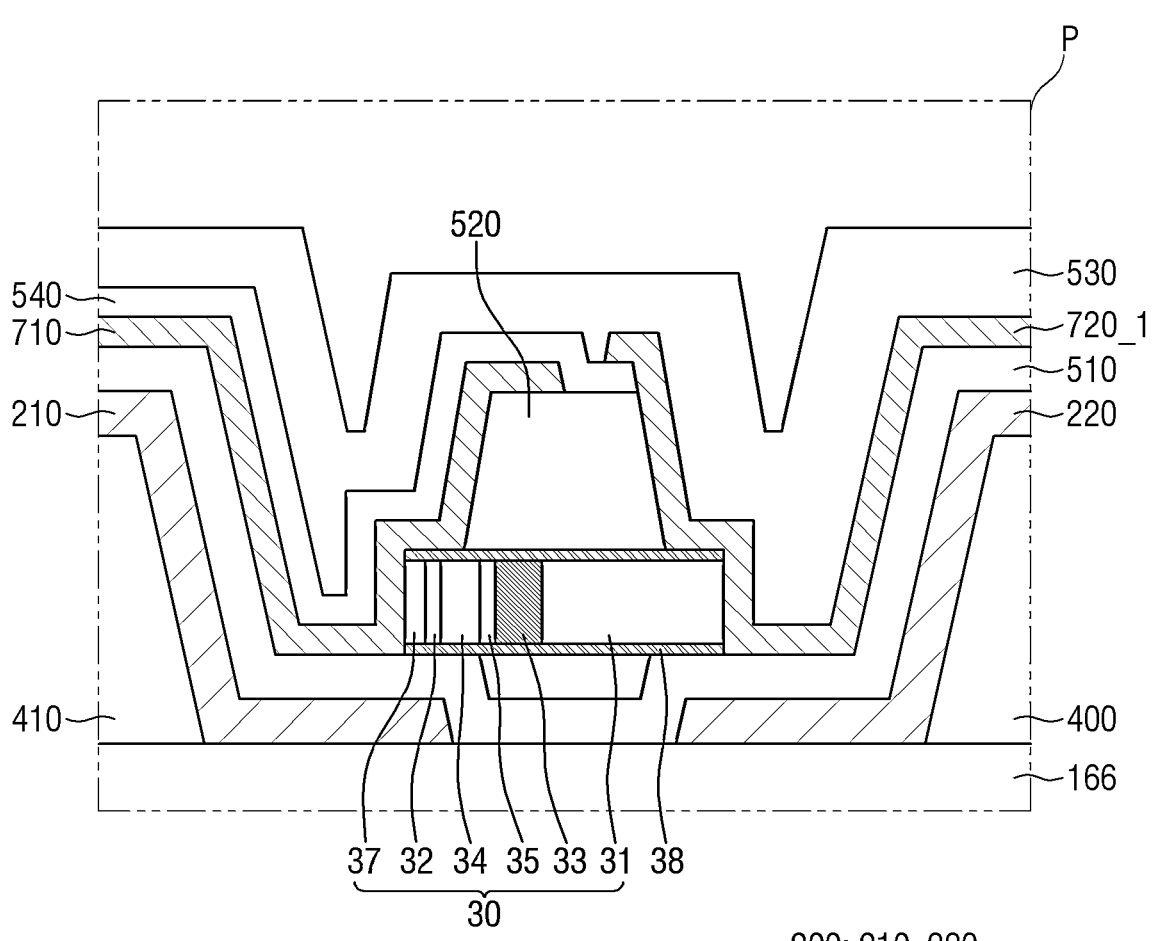
FIG. 13 is a schematic enlarged cross-sectional view illustrating embodiment of area P of FIG. 11.

FIG. 13 is a schematic enlarged cross-sectional view illustrating an embodiment of area P of FIG. 11.

Referring to FIG. 13, a display device 10 according to the embodiment is different from the display device 10 according to the embodiment described above with reference to FIG. 12 in that a contact electrode 700_1 includes a first contact electrode 710 and a second contact electrode 720_1 formed on different layers and the light emitting element layer further includes a fourth insulating layer 540.

Specifically, the contact electrode 700_1 may include a first contact electrode 710 and a second contact electrode 720_1 formed on different layers.

The first contact electrode 710 may be disposed on the first electrode 210 and an end of the light emitting element ED. The first contact electrode 710 may extend from an end of the light emitting element ED toward the second insulating layer 520 to be also disposed on a sidewall of the second insulating layer 520 and an upper surface of the second insulating layer 520. The first contact electrode 710 may be disposed on the upper surface of the second insulating layer 520, but may expose at least a portion of the upper surface of the second insulating layer 520.

The fourth insulating layer 540 may be disposed on the first contact electrode 710. The fourth insulating layer 540 may be disposed to completely cover the first contact electrode 710. The fourth insulating layer 540 may be disposed to completely cover a sidewall and the upper surface of the second insulating layer 520, but may not be disposed on another sidewall of the second insulating layer 520. An end of the fourth insulating layer 540 may be aligned with the other sidewall of the second insulating layer 520.

The second contact electrode 720_1 may be disposed on the second electrode 220 and another end of the light emitting element ED. The second contact electrode 720_1 may extend from the other end of the light emitting element ED toward the second insulating layer 520 to be also disposed on the other sidewall of the second insulating layer 520 and an upper surface of the fourth insulating layer 540.

The third insulating layer 530 may be disposed on the fourth insulating layer 540 and the second contact electrode 720_1. The third insulating layer 530 may be disposed on the fourth insulating layer 540 and the second contact electrode 720_1 to cover the fourth insulating layer 540 and the second contact electrode 720_1.

In the embodiment, a manufacturing process of the display device 10 may be added by forming the first contact electrode 710 and the second contact electrode 720_1 on the different layers and interposing the fourth insulating layer 540 between the first contact electrode 710 and the second contact electrode 720_1, such that the efficiency of the process of manufacturing the display device 10 may decrease, but reliability of the display device 10 may be improved. Specifically, a problem that the first contact electrode 710 and the second contact electrode 720_1 are short-circuited in the process of manufacturing the display device 10 may be minimized by forming the first contact electrode 710 and the second contact electrode 720_1 on the different layers and further disposing the fourth insulating layer 540 between the first contact electrode 710 and the second contact electrode 720_1.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light emitting element comprising:
a light emitting element core including a first area and a second area surrounding the first area, wherein
the light emitting element core comprises:
a first semiconductor layer doped with a first conductivity-type dopant;
a second semiconductor layer disposed on the first semiconductor layer;
the second semiconductor layer doped with a second conductivity-type dopant different from the first conductivity-type dopant;
an element active layer disposed between the first semiconductor layer and the second semiconductor layer; and
a third semiconductor layer disposed between the element active layer and the second semiconductor layer, the third semiconductor layer doped with the second conductivity-type dopant,
the second area of the light emitting element core is located on an outer circumference of the light emitting element core, the second area of the light emitting element including an outer surface of the light emitting element core, and
a doping concentration of the second conductivity-type dopant of the third semiconductor layer is lower than a defect density of the second area of the light emitting element core.

2. The light emitting element of claim 1, wherein the doping concentration of the second conductivity-type dopant of the third semiconductor layer is about $10^{18}/cm^3$ or less.

3. The light emitting element of claim 2, wherein
the first semiconductor layer is an n-type semiconductor layer, and
the second semiconductor layer and the third semiconductor layer are each a p-type semiconductor layer.

4. The light emitting element of claim 3, further comprising:

an electron blocking layer disposed between the element active layer and the third semiconductor layer, wherein the electron blocking layer has a single-layer structure.

5. The light emitting element of claim 3, further comprising:

an electron blocking layer disposed between the element active layer and the third semiconductor layer, wherein a thickness of the electron blocking layer is about 5 nm or less.

6. The light emitting element of claim 3, further comprising:

an electron blocking layer disposed between the element active layer and the third semiconductor layer, wherein, the electron blocking layer includes aluminum (Al), and a composition of the aluminum in the electron blocking layer is about 15% or less.

7. The light emitting element of claim 2, wherein the doping concentration of the second conductivity-type dopant of the third semiconductor layer is lower than a doping concentration of the second conductivity-type dopant of the second semiconductor layer.

8. The light emitting element of claim 1, wherein a thickness of the third semiconductor layer is greater than a thickness of the second semiconductor layer.

9. The light emitting element of claim 8, further comprising:

an electron blocking layer disposed between the element active layer and the third semiconductor layer, wherein a thickness of the electron blocking layer is smaller than the thickness of the third semiconductor layer.

10. The light emitting element of claim 1, wherein the light emitting element core extends in a first direction, the first semiconductor layer, the element active layer, the third semiconductor layer, and the second semiconductor layer are sequentially disposed in the first direction, and a width of the light emitting element core is about 10 μm or less.

11. A display device comprising:

a first electrode and a second electrode disposed on a substrate and spaced apart from each other; and a light emitting element disposed between the first electrode and the second electrode, wherein, the light emitting element comprises a light emitting element core including a first area and a second area surrounding the first area, the light emitting element core comprises:

a first semiconductor layer doped with a first conductivity-type dopant;

a second semiconductor layer disposed on the first semiconductor layer, the second semiconductor layer doped with a second conductivity-type dopant different from the first conductivity-type dopant;

an element active layer disposed between the first semiconductor layer and the second semiconductor layer; and a third semiconductor layer disposed between the element active layer and the second semiconductor layer the third semiconductor layer doped with the second conductivity-type dopant the second area of the light emitting element core is located on an outer circumference of the light emitting element core, the second area of the light emitting element including an outer surface of the light emitting element core, and a doping concentration of the second conductivity-type dopant of the third semiconductor layer is lower than a defect density of the second area of the light emitting element core.

12. The display device of claim 11, wherein the doping concentration of the second conductivity-type dopant of the third semiconductor layer is about $10^{18}/cm^3$ or less.

\* \* \* \* \*